(12) United States Patent
Yun et al.

(10) Patent No.: US 7,705,372 B2
(45) Date of Patent: Apr. 27, 2010

(54) ELECTROMECHANICAL MEMORY DEVICES AND METHODS OF MANUFACTURING THE SAME

(75) Inventors: Eunjung Yun, Seoul (KR); Sung-Young Lee, Yungin (KR); Dong-Won Kim, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 544 days.

(21) Appl. No.: 11/713,476

(22) Filed: Mar. 2, 2007

(65) Prior Publication Data

US 2008/0035960 A1    Feb. 14, 2008

(30) Foreign Application Priority Data

Aug. 7, 2006    (KR) .................... 10-2006-0074015

(51) Int. Cl.
    *H01L 29/78*    (2006.01)
(52) U.S. Cl. .................. 257/209; 257/316; 257/415; 257/E21.602
(58) Field of Classification Search ............ 257/209, 257/316, 415, E21.602
    See application file for complete search history.

(56) References Cited

U.S. PATENT DOCUMENTS 7,573,739 B2 *    8/2009    Yun et al. ............ 365/185.03

2004/0181630 A1    9/2004    Jaiprakash et al.
2008/0048246 A1 *  2/2008    Yun et al. .............. 257/324

* cited by examiner

*Primary Examiner*—Jack Chen
(74) *Attorney, Agent, or Firm*—Mills & Onello, LLP

(57) ABSTRACT

In a memory device and a method of forming the same, in one embodiment, the memory device comprises a first word line structure on a substrate, the first word line structure extending in a first direction. A bit line is provided over the first word line structure and spaced apart from the first word line by a first gap, the bit line extending in a second direction transverse to the first direction. A second word line structure is provided over the bit line and spaced apart from the bit line by a second gap, the second word line structure extending in the first direction. The bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

38 Claims, 46 Drawing Sheets

FIG. 3A

OPERATION CONDITIONS

| | Read | Write"0" | Write"1" | Initial program | Erase (write all"0") |
|---|---|---|---|---|---|
| $V_{B/L}$ | GND | ½$V_{pull-in}$ | ½$V_{pull-out}$ | ++ | GND |
| $V_{WWL}$ | GND | ½$V_{pull-out}$ | ½$V_{pull-in}$ | -- | - |
| $V_{RWL}$ | - | GND or floating | GND or floating | GND | GND |

WRITE STATE="0"

READ"0"

WRITE STATE="0"

READ"0"

ELECTROMECHANICAL MEMORY DEVICES AND METHODS OF MANUFACTURING THE SAME

RELATED APPLICATIONS

This application claims priority under 35 U.S.C. 119 to Korean Patent Application No. 10-2006-0074015 filed on Aug. 7, 2006, the content of which is incorporated herein by reference in its entirety.

This application is related to U.S. patent application Ser. No. 11/713,770, filed Mar. 2, 2007, entitled "Multi-bit Electromechanical Memory Devices and Methods of Manufacturing the Same," by Yun, et al., filed of even date herewith, incorporated herein by reference, and commonly owned with the present application.

BACKGROUND OF THE INVENTION

Semiconductor memory devices include memory cells for the storage of electronic information. Non-volatile memory devices enjoy widespread use because their associated memory cells can retain information even when the source power supply is disabled or removed. This feature makes non-volatile memory devices especially attractive for use in portable electronics. With the continuous trend toward higher integration, high-density layout, low-power operation, and high operating speed are common considerations for such devices.

One type of non-volatile device, referred to as flash memory, has become popular because it is relatively inexpensive to produce, and because it operates at relatively low power demands; however, flash memory is known to generally suffer from low operating speed, relatively poor data retention reliability and relatively short life span. In addition, such devices are based on the operation of conventional transistors, and with the pressures of further integration, they increasingly suffer from the short-channel effect, lowering of breakdown voltage, and lowering of reliability of the gate junction with repeated program/erase cycles. In addition, as the size of the transistor decreases, there is an increased likelihood of intercell interference, which can have a further adverse effect on performance and reliability.

SUMMARY OF THE INVENTION

Embodiments of the present invention are directed to electromechanical memory devices and methods of manufacture thereof that address and alleviate the above-identified limitations of conventional devices. In particular, embodiments of the present invention provide electromechanical memory devices that realize, among other features, high-density storage, low-voltage program and erase voltages, high-speed operation, enhanced data retention, and high long-term endurance, and methods of formation of such devices. The embodiments of the present invention are applicable to both non-volatile and volatile memory device formats.

In one aspect, a memory device comprises: a substrate; a first word line structure on the substrate, the first word line structure extending in a first direction; a bit line over the first word line structure and spaced apart from the first word line by a first gap, the bit line extending in a second direction transverse to the first direction; and a second word line structure over the bit line and spaced apart from the bit line by a second gap, the second word line structure extending in the first direction, wherein the bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In one embodiment, the first word line structure comprises a write word line and wherein the second word line structure comprises a read word line.

In another embodiment, the bit line comprises first and second portions that extend in a direction along sidewalls of the first word line structure and a third portion that extends in a direction along a top of the first word line structure between the first and second portions.

In another embodiment, the first gap extends between the first and second portions of the bit line and the first word line structure and between the third portion of the bit line and the first word line structure.

In another embodiment, the memory device further comprises a dielectric layer on the substrate and the bit line, and wherein the second gap extends between the third portion of the bit line and the second word line structure and extends between the first and second portions of the bit line and the dielectric layer.

In another embodiment, the second gap extends between the third portion of the bit line and the second word line structure.

In another embodiment, the bit line comprises an elastically deformable material.

In another embodiment, the bit line comprises at least one material selected from the group consisting of: gold, silver, copper, aluminum, tungsten, TiN, conductive metal, shaped memory alloy, and nanotubes.

In another embodiment, the first word line structure and second word line structure each comprise a conductor, and wherein the memory device comprises a volatile memory device.

In another embodiment, at least one of the first word line structure and the second word line structure comprises: a conductive layer; and a charge trapping structure between the conductive layer and the bit line and spaced apart from the bit line by a corresponding one of the first and second gaps, and wherein the memory device comprises a non-volatile memory device.

In another embodiment, in at least one of the first bent position and second bent position, the bit line is capacitively coupled to the charge trapping structure of the corresponding at least one first word line structure and second word line structure.

In another embodiment, in the at least one of the first bent position and second bent position, the bit line is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the memory device further comprises a transition layer between the conductive layer and the charge trapping structure of the at least one of the first and second word line structures.

In another embodiment, one of the first and second word line structures comprises a write word line structure and wherein another of the first and second word line structures comprises a read word line structure, and wherein, during a programming operation of the non-volatile memory device, the bit line is placed in one of the a bent position in contact with the write word line structure and the rest position, by applying a first voltage potential between the write word line structure and the bit line.

In another embodiment, during a programming operation of a first state of the non-volatile memory device that results in the bit line being placed in a bent position in contact with the write word line structure, the bit line bends to make contact with the charge trapping structure of the write word line structure in the bent position in response to the first voltage potential between the write word line structure and the bit line, and wherein, when the first voltage potential between the write word line structure and the bit line is removed, the bit line remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the bit line remains in the bent position in contact with the write word line structure, despite application of the second voltage potential.

In another embodiment, during a programming operation of a second state of the non-volatile memory device that results in the bit line being placed in the rest position, the bit line is isolated from the charge trapping structure of the write word line structure in the rest position in response to the first voltage potential between the write word line structure and the bit line, and wherein, when the first voltage potential between the write word line structure and the bit line is removed, the bit line remains in the rest position.

In another embodiment, during a read operation of the non-volatile memory device in the second state, a second voltage potential is applied between the bit line and the read word line structure, and wherein the read operation results in the determination of the second state when the bit line is placed in a bent position in contact with the read word line structure as a result of the applied second voltage potential.

In another embodiment, the first word line structure comprises a conductive layer and a charge trapping structure on the conductive layer, the charge trapping structure between the conductive layer of the first word line structure and the bit line, and the charge trapping structure being spaced apart from the bit line by the first gap, and wherein the memory device comprises a non-volatile memory device.

In another embodiment, the second word line structure comprises a conductive layer and a charge trapping structure under the conductive layer, the charge trapping structure between the conductive layer of the second word line structure and the bit line, and the charge trapping structure being spaced apart from the bit line by the second gap, and wherein the memory device comprises a non-volatile memory device.

In another aspect, a memory device comprises: a substrate; a first word line structure on the substrate, the first word line structure extending in a first direction; a bit line over the first word line structure and spaced apart from the first word line by a first gap, the bit line extending in a second direction transverse to the first direction; and a second word line structure over the bit line and spaced apart from the bit line by a second gap, the second word line structure extending in the first direction, wherein one of the first line structure and the second word lie structure comprises a charge trapping structure between a conductive layer of one of the word line structures and the bit line, wherein the charge trapping structure is spaced apart from the bit line by a corresponding one of the first and second gaps, and wherein the bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In one embodiment, the one of the first and second word line structures comprises a write word line and wherein the other of the first and second word line structures comprises a read word line.

In another embodiment, the bit line comprises first and second portions that extend in a direction along sidewalls of the first word line structure and a third portion that extends in a direction along a top of the first word line structure between the first and second portions.

In another embodiment, the first gap extends between the first and second portions of the bit line and the first word line structure and between the third portion of the bit line and the first word line structure.

In another embodiment, the memory device further comprises a dielectric layer on the substrate and the bit line, and wherein the second gap extends between the third portion of the bit line and the second word line structure and extends between the first and second portions of the bit line and the dielectric layer.

In another embodiment, the second gap extends between the third portion of the bit line and the second word line structure.

In another embodiment, the bit line comprises an elastically deformable material.

In another embodiment, the bit line comprises at least one material selected from the group consisting of: gold, silver, copper, aluminum, tungsten, TiN, conductive metal, shaped memory alloy, and nanotubes.

In another embodiment, in at least one of the first bent position and second bent position, the bit line is capacitively coupled to the charge trapping structure of the corresponding at least one first word line structure and second word line structure.

In another embodiment, in the at least one of the first bent position and second bent position, the bit line is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the memory device further comprises a transition layer between the conductive layer and the charge trapping structure of the at least one of the first and second word line structures.

In another embodiment, the one of the first and second word line structures comprises a write word line structure and wherein another of the first and second word line structures comprises a read word line structure, and wherein, during a programming operation of the non-volatile memory device, the bit line is placed in one of the a bent position in contact with the write word line structure and the rest position, by applying a first voltage potential between the write word line structure and the bit line.

In another embodiment, during a programming operation of a first state of the non-volatile memory device that results in the bit line being placed in a bent position in contact with the write word line structure, the bit line bends to make contact with the charge trapping structure of the write word line structure in the bent position in response to the first voltage potential between the write word line structure and the bit line, and wherein, when the first voltage potential between the write word line structure and the bit line is removed, the bit line remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the bit line remains in the bent position in contact with the write word line structure, despite application of the second voltage potential.

In another embodiment, during a programming operation of a second state of the non-volatile memory device that results in the bit line being placed in the rest position, the bit line is isolated from the charge trapping structure of the write word line structure in the rest position in response to the first voltage potential between the write word line structure and the bit line, and wherein, when the first voltage potential between the write word line structure and the bit line is removed, the bit line remains in the rest position.

In another embodiment, during a read operation of the non-volatile memory device in the second state, a second voltage potential is applied between the bit line and the read word line structure, and wherein the read operation results in the determination of the second state when the bit line is placed in a bent position in contact with the read word line structure as a result of the applied second voltage potential.

In another aspect, a stacked memory device comprises: a first device layer including a first array of memory cells; a second device layer including a second array of memory cells; a third device layer including control circuitry for accessing the first array of memory cells and the second array of memory cells, the first, second and third device layers being vertically arranged with respect to each other, wherein the memory cells of the first array of memory cells and the second array of memory cells each include: a first word line structure; a second word line structure spaced apart from the first word line structure; and a bit line that extends over an upper surface of the first word line structure and below a lower surface of the second word line structure, the bit line being spaced apart from the first word line structure by a first gap and being spaced apart from the second word line structure by a second gap, the bit line being suspended between the first word line structure and the second word line structure.

In one embodiment, the memory cells of the first array of memory cells are non-volatile memory cells and the memory cells of the second array of memory cells are volatile memory cells.

In another embodiment, the memory cells of both the first array of memory cells and the second array of memory cells are volatile memory cells.

In another embodiment, the memory cells of both the first array of memory cells and the second array of memory cells are non-volatile memory cells.

In another embodiment, in each of the memory cells, the bit line comprises first and second portions that extend in a direction along sidewalls of the first word line structure and a third portion that extends in a direction along a top of the first word line structure between the first and second portions.

In another embodiment, the first gap extends between the first and second portions of the bit line and the first word line structure and between the third portion of the bit line and the first word line structure.

In another embodiment, the stacked memory device further comprises a dielectric layer on the substrate and the bit line, wherein the second gap extends between the third portion of the bit line and the second word line structure and extends between the first and second portions of the bit line and the dielectric layer.

In another embodiment, the second gap extends between the third portion of the bit line and the second word line structure.

In another embodiment, the bit line comprises an elastically deformable material.

In another embodiment, the bit line comprises at least one material selected from the group consisting of: gold, silver, copper, aluminum, tungsten, TiN, conductive metal, shaped memory alloy, and nanotubes.

In another embodiment, the memory cells of at least one of the array and second array comprise volatile memory cells and in the at least one array, the first word line structure and second word line structure each comprise a conductor.

In another embodiment, in each of the memory cells, the bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In another embodiment, in each of the memory cells, the electrode comprises an elastically deformable material.

In another embodiment, the memory cells of at least one of the first array and second array comprise non-volatile memory cells, and in the memory cells of the at least one array, at least one of the first word line structure and the second word line structure comprises: a conductive layer; and a charge trapping structure between the conductive layer and the bit line and spaced apart from the bit line by a corresponding one of the first and second gaps.

In another embodiment, in at least one of the first bent position and second bent position, the bit line is capacitively coupled to the charge trapping structure of the corresponding at least one first word line structure and second word line structure.

In another embodiment, in the at least one of the first bent position and second bent position, the bit line is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the stacked memory device further comprises in the memory cells of the at least one array, a transition layer between the conductive layer and the charge trapping structure of the at least one of the first and second word line structures.

In another embodiment, one of the first and second word line structures comprises a write word line structure and wherein another of the first and second word line structures comprises a read word line structure, and wherein, during a programming operation of the non-volatile memory device, the bit line is placed in one of the a bent position in contact with the write word line structure and the rest position, by applying a first voltage potential between the write word line structure and the bit line.

In another embodiment, during a programming operation of a first state of the non-volatile memory device that results in the bit line being placed in a bent position in contact with the write word line structure, the bit line bends to make contact with the charge trapping structure of the write word line structure in the bent position in response to the first voltage potential between the write word line structure and the bit line, and wherein, when the first voltage potential between the write word line structure and the bit line is removed, the bit line remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the bit line remains in the bent position in contact with the write word line structure, despite application of the second voltage potential.

In another embodiment, during a programming operation of a second state of the non-volatile memory device that results in the bit line being placed in the rest position, the bit line is isolated from the charge trapping structure of the write word line structure in the rest position in response to the first voltage potential between the write word line structure and the bit line, and wherein, when the first voltage potential between the write word line structure and the bit line is removed, the bit line remains in the rest position.

In another embodiment, during a read operation of the non-volatile memory device in the second state, a second voltage potential is applied between the bit line and the read word line structure, and wherein the read operation results in the determination of the second state when the bit line is placed in a bent position in contact with the read word line structure as a result of the applied second voltage potential.

In another aspect, a method of forming a memory device comprises: providing a first word line structure on a substrate extending in a first direction; providing a first sacrificial layer on the first word line structure; providing a bit line on the first sacrificial layer extending in a second direction transverse to the first direction; and providing a second sacrificial layer on the bit line; providing a second word line structure on the second sacrificial layer, the second word line structure extending in the first direction; and removing the first and second sacrificial layers to form a first gap between the bit line and the first word line structure and to form a second gap between the bit line and the second word line structure.

In one embodiment, the bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In another embodiment, the method further comprises patterning the first word line structure before providing the first sacrificial layer and following providing the first sacrificial layer, patterning the first sacrificial layer.

In another embodiment, the method further comprises patterning the second sacrificial layer before providing the second word line structure.

In another embodiment, the method further comprises further comprising patterning the second word line structure and the second sacrificial layer at the same time.

In another embodiment, the bit line comprises first and second portions that extend in a direction along sidewalls of the first word line structure and a third portion that extends in a direction along a top of the first word line structure between the first and second portions.

In another embodiment, the first gap extends between the first and second portions of the bit line and the first word line structure and between the third portion of the bit line and the first word line structure.

In another embodiment, the method further comprises a dielectric layer on the substrate and the bit line, and wherein the second gap extends between the third portion of the bit line and the second word line structure and extends between the first and second portions of the bit line and the dielectric layer.

In another embodiment, the second gap extends between the third portion of the bit line and the second word line structure.

In another embodiment, the bit line comprises an elastically deformable material.

In another embodiment, the bit line comprises at least one material selected from the group consisting of: gold, silver, copper, aluminum, tungsten, TiN, conductive metal, shaped memory alloy, and nanotubes.

In another embodiment, the first word line structure and second word line structure each comprise a conductor, and wherein the memory device comprises a volatile memory device.

In another embodiment, at least one of the first word line structure and the second word line structure comprises: a conductive layer; and a charge trapping structure between the conductive layer and the bit line and spaced apart from the bit line by a corresponding one of the first and second gaps, and wherein the memory device comprises a non-volatile memory device.

In another embodiment, in at least one of the first bent position and second bent position, the bit line is capacitively coupled to the charge trapping structure of the corresponding at least one first word line structure and second word line structure.

In another embodiment, in the at least one of the first bent position and second bent position, the bit line is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the method further comprises a transition layer between the conductive layer and the charge trapping structure of the at least one of the first and second word line structures.

In another embodiment, one of the first and second word line structures comprises a write word line structure and wherein another of the first and second word line structures comprises a read word line structure, and wherein, during a programming operation of the non-volatile memory device, the bit line is placed in one of the a bent position in contact with the write word line structure and the rest position, by applying a first voltage potential between the write word line structure and the bit line.

In another embodiment, during a programming operation of a first state of the non-volatile memory device that results in the bit line being placed in a bent position in contact with the write word line structure, the bit line bends to make contact with the charge trapping structure of the write word line structure in the bent position in response to the first voltage potential between the write word line structure and the bit line, and wherein, when the first voltage potential between the write word line structure and the bit line is removed, the bit line remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the bit line remains in the bent position in contact with the write word line structure, despite application of the second voltage potential.

In another embodiment, during a programming operation of a second state of the non-volatile memory device that results in the bit line being placed in the rest position, the bit line is isolated from the charge trapping structure of the write word line structure in the rest position in response to the first voltage potential between the write word line structure and the bit line, and wherein, when the first voltage potential between the write word line structure and the bit line is removed, the bit line remains in the rest position.

In another embodiment, during a read operation of the non-volatile memory device in the second state, a second voltage potential is applied between the bit line and the read word line structure, and wherein the read operation results in the determination of the second state when the bit line is placed in a bent position in contact with the read word line structure as a result of the applied second voltage potential.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIG. 3A is an example chart of applied voltages for performing programming, write, erase and read operations of the unit memory cell embodiment of FIGS. 2A-2C.

FIGS. 6A-14A are perspective views of a method for forming an electromechanical non-volatile memory device in accordance with an embodiment of the present invention; FIGS. 6B-14B are sectional views taken along section lines I-I' of FIGS. 6A-14A respectively; FIGS. 6C-14C are sectional views taken along section lines II-II' of FIGS. 6A-14A respectively;

FIGS. 15A-22A are perspective views of a method for forming an electromechanical non-volatile memory device in accordance with another embodiment of the present invention; FIGS. 15B-22B are sectional views taken along section lines I-I' of FIGS. 15A-22A respectively; FIGS. 15C-22C are sectional views taken along section lines II-II' of FIGS. 15A-22A respectively;

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap. As used herein, the term "word line structure" can include a conductive word line itself, or a conductive word line and corresponding charge trapping structure, or additional structures or components that are associated with the word line.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
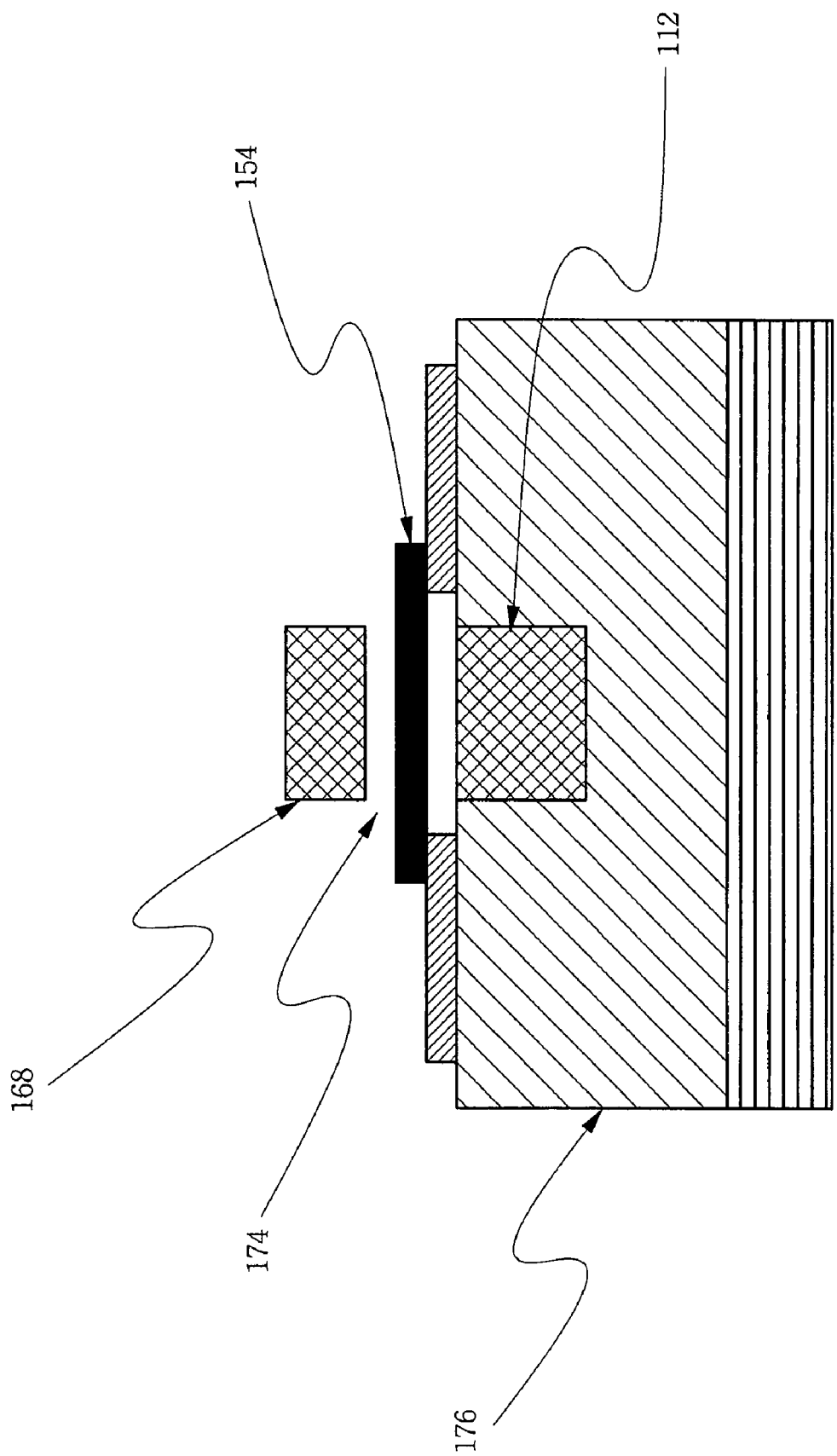
FIG. 1 is a cross-sectional view of an illustrative embodiment of a conventional type of memory device that utilizes electromechanical interaction for programming the state of the device.

Next-generation, emerging technologies are under development in an effort to address the limitations associated with contemporary flash memory platforms. One such design is disclosed by Jaiprakash, et al., United States Patent Application Publication 2004/0181630, the content of which is incorporated herein by reference. FIG. 1 is a cross-sectional view of an illustrative embodiment of the type of device disclosed in the Jaiprakash, et al. reference.

With reference to FIG. 1, this system relies on a flexible fabric 154 that operates as a mechanical switch that is suspended in the gaps 174 between first and second electrodes 168, 112. The position of the fabric 154 relative to the electrodes 168, 122 is programmable to provide data states, so that the device is operable as a switch. The flexible fabric 154 is formed of a carbon nanotube material, which is expensive to produce, and the accurate placement of which in a semiconductor manufacturing process is difficult to control. In addition, this device is not readily manufacturable in a dense array of cells; therefore, its application to low-cost, high-density semiconductor devices is somewhat limited.

Embodiments of the present invention as illustrated herein provide electromechanical memory devices that provide, among other features, high-density storage, low-voltage program and erase voltages, high-speed operation, enhanced data retention, and high longevity, and methods of formation of such devices. Data retention is ensured by Coulomb forces, rather than through electron tunneling. This leads to enhanced longevity and longer, and more reliable, data retention. In addition, further integration of the devices is not limited by the short-channel effect or by lowering of breakdown voltage. Also, device longevity is maintained through repeated program/erase cycles, since such cycles are not dependent on the properties of gate insulator materials. In addition, intercell interference is mitigated or eliminated because cell data status is determined mechanically, rather than electrically. A relatively simple manufacturing process can be used to form the devices, using standard fabrication techniques.

Figure 2A:
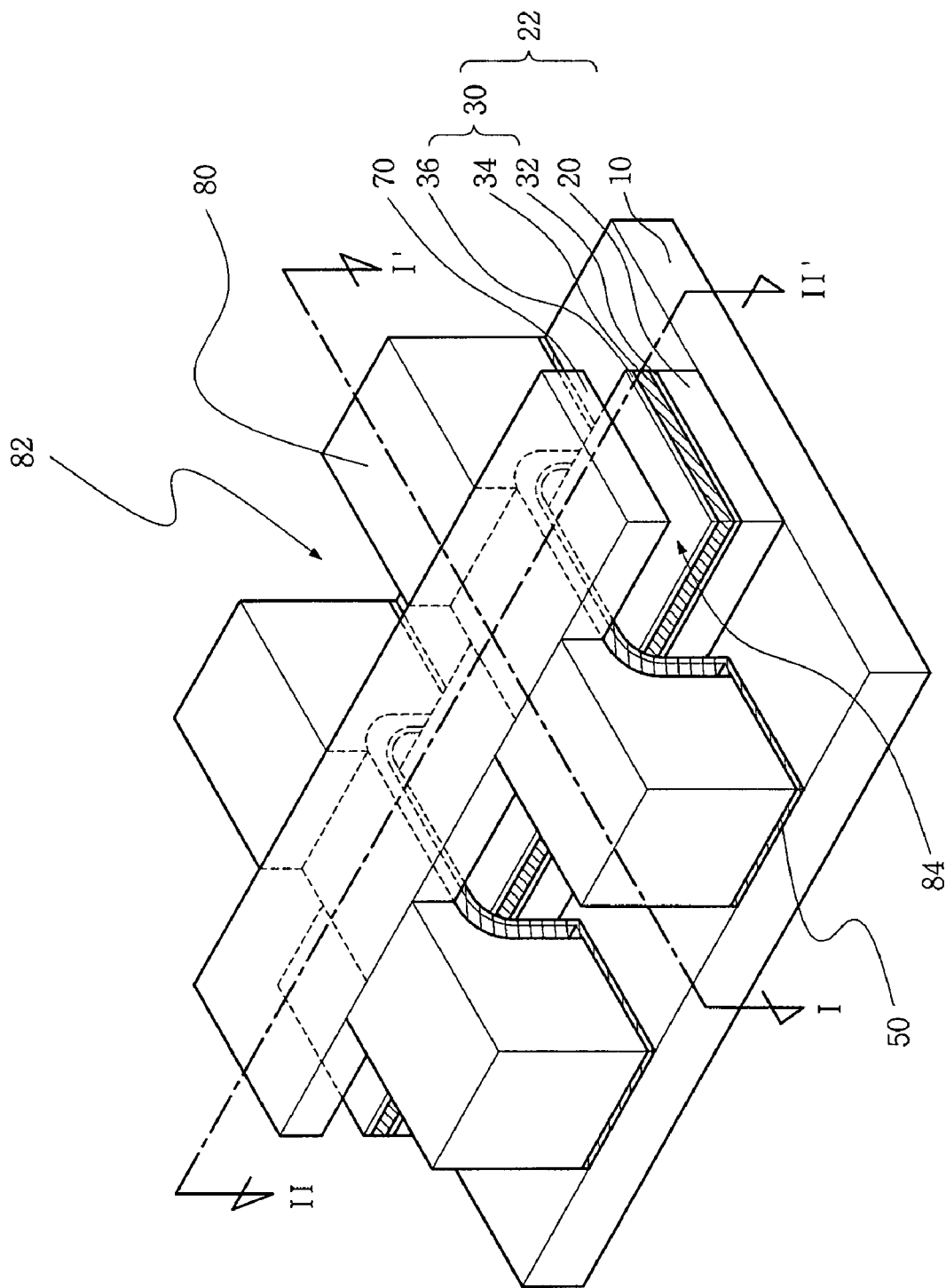
FIG. 2A is a perspective view of an electromechanical non-volatile memory device in accordance with an embodiment of the present invention.
Figure 2B:
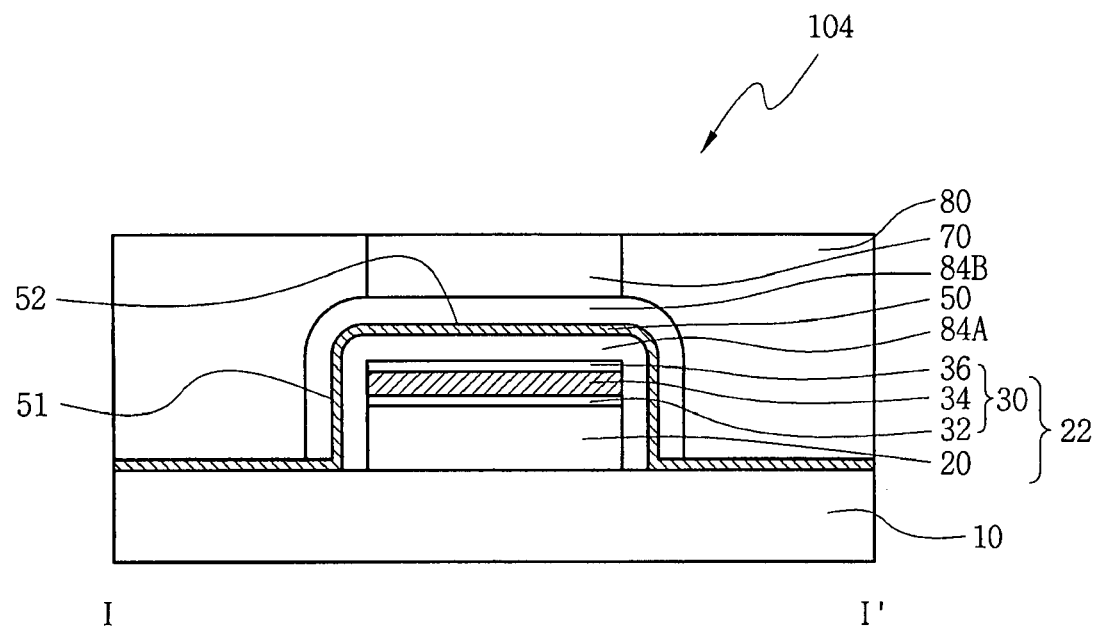
FIG. 2B is a sectional view taken along section lines I-I' of FIG. 2A.
Figure 2C:
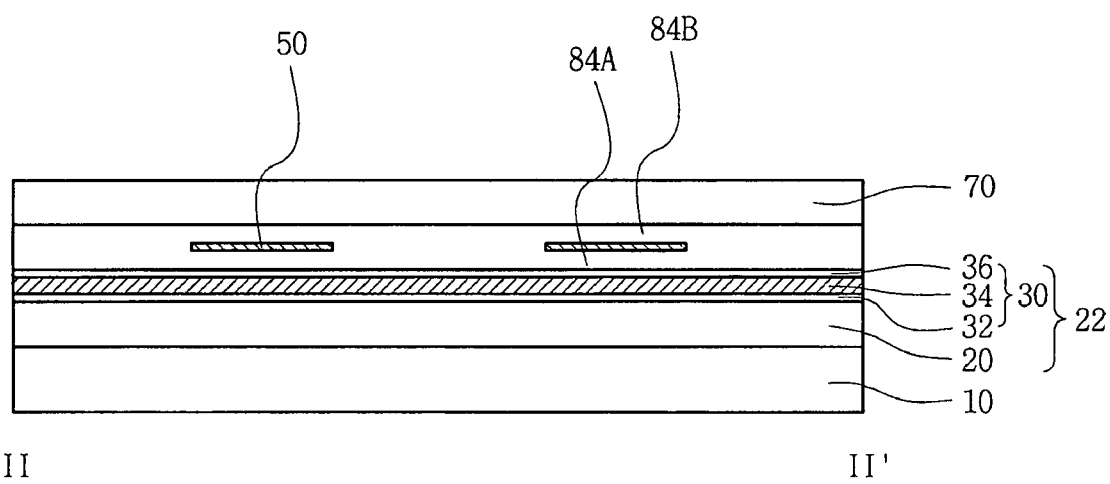
FIG. 2C is a sectional view taken along section lines II-II' of FIG. 2A.

FIG. 2A is a perspective view of an electromechanical non-volatile memory device in accordance with an embodiment of the present invention. FIG. 2B is a sectional view taken along section lines I-I' of FIG. 2A. FIG. 2C is a sectional view taken along section lines II-II' of FIG. 2A With reference to FIGS. 2A-2C, a plurality of lower word line structures 22 extend on a substrate 10 in a first direction. The lower word line structures 22 each include a conductive word line 20 and a charge trapping structure 30 on the conductive word line 20. The lower word line structures 22 are patterned to be spaced apart from each other on the substrate so as to form an array. A plurality of bit lines 50 are provided on the substrate and on the word line structures 22. The bit lines 50 extend in a second direction on the substrate that is transverse to the first direction, and are patterned to be spaced apart from each other so as to form an array. The bit lines 50 are spaced apart from the lower word line structures 22 in a vertical direction by a lower gap 84A. In this manner, the bit lines 50 and lower word line structures 22 intersect each other, and each intersection point corresponds with a memory cell of the device. The term "transverse", as used herein, when referring to the first and second directions of extension of the various components, refers to relative directions of extension that are other than parallel to each other, and includes, for example, any angle, including 90 degrees, with respect to each other.

The bit lines 50 each include a first portion 52 that extends generally in a horizontal direction, parallel to an upper surface of the substrate 10, and second portions 51 that extend generally in a vertical direction relative to the substrate. In this manner, each bit line 50 forms an arch-type structure that is suspended over, and spaced apart from, the underlying, intersecting, lower word line structure 22.

A plurality of upper word line structures 70 are formed over the bit lines 50 and the lower word line structures 22, and, like the lower word line structures 22, extend in the first direction on the substrate 10 to intersect the bit lines 50. In this embodiment, the upper word line structure 70 comprises a conductive word line; however, a charge trapping structure can alternatively or additionally be formed on an underside of the upper word line structure 70, depending on the application. Each upper word line structure 70 is spaced apart in a vertical direction from the underlying, intersecting, bit line 50 by an upper gap 84B. The upper word line structures 70 are supported by a first interlayer dielectric layer 80. In the present embodiment, the upper gap 84B extends between the bit line 50 and the first dielectric layer 80 and between the bit line 50 and upper word line structure 70, along the lengths of both the first and second portions 52, 51 of the bit line 50.

Unit memory cells 104 neighboring each other in the first direction of extension share a common lower word line structure 22 and a common upper word line structure 70, and unit memory cells neighboring each other in the second direction of extension share a common bit line 50.

In one embodiment, the charge trapping structures 30 correspond to, and are formed on, the lower word lines 20, as shown, and therefore, the lower word lines 20 operate as write word lines for the corresponding memory cells 104, and the upper word lines 70 operate as read word lines for the corresponding memory units 104. In another embodiment, the charge trapping layer structures 30 can be formed below the upper word lines 70, and in this embodiment, the lower word lines 20 operate as read word lines for the corresponding memory cells, and the upper word lines 70 operate as write word lines for the corresponding memory units 104. The operation of the read and write word lines for the device will be described in further detail below.

In the illustrative embodiment depicted in FIGS. 2A-2C, the bit line 50 is suspended in position between the lower and upper gaps 84A, 84B, between the lower word line structure 22 and the upper word line 70, and is formed of an elastically deformable material so as to be movable through the lower and upper gaps 84A, 84B. By controlling the position of the bit line 50 in the gaps 84A, 84B, the bit line 50 can be caused to make contact, for example, in an engaged position, with the charge trapping structure 30 of the lower word line structure 22 or with the upper word line 70, or can be made to be suspended, for example, in a rest position, between the charge trapping structure 30 and the upper word line 70 and not make contact with either. By controlling the respective voltage levels of the voltages applied to the bit line 50, and applied to the independent write and read word lines 20, 70, programming, erase, write, and read operations of each of the memory cells 104 can be performed, as will be described in detail below. For example, by applying a suitable voltage level to the write word line 20, and by applying a suitable voltage level to the read word line 70, the state of the memory cell 104 can be programmed to a "1" state or to a "0" state. Later, by applying suitable voltage levels to the bit line 50 and the read word line 70, a read operation of the state of the memory cell 104 can be performed, as will be described below.

Figure 3B:
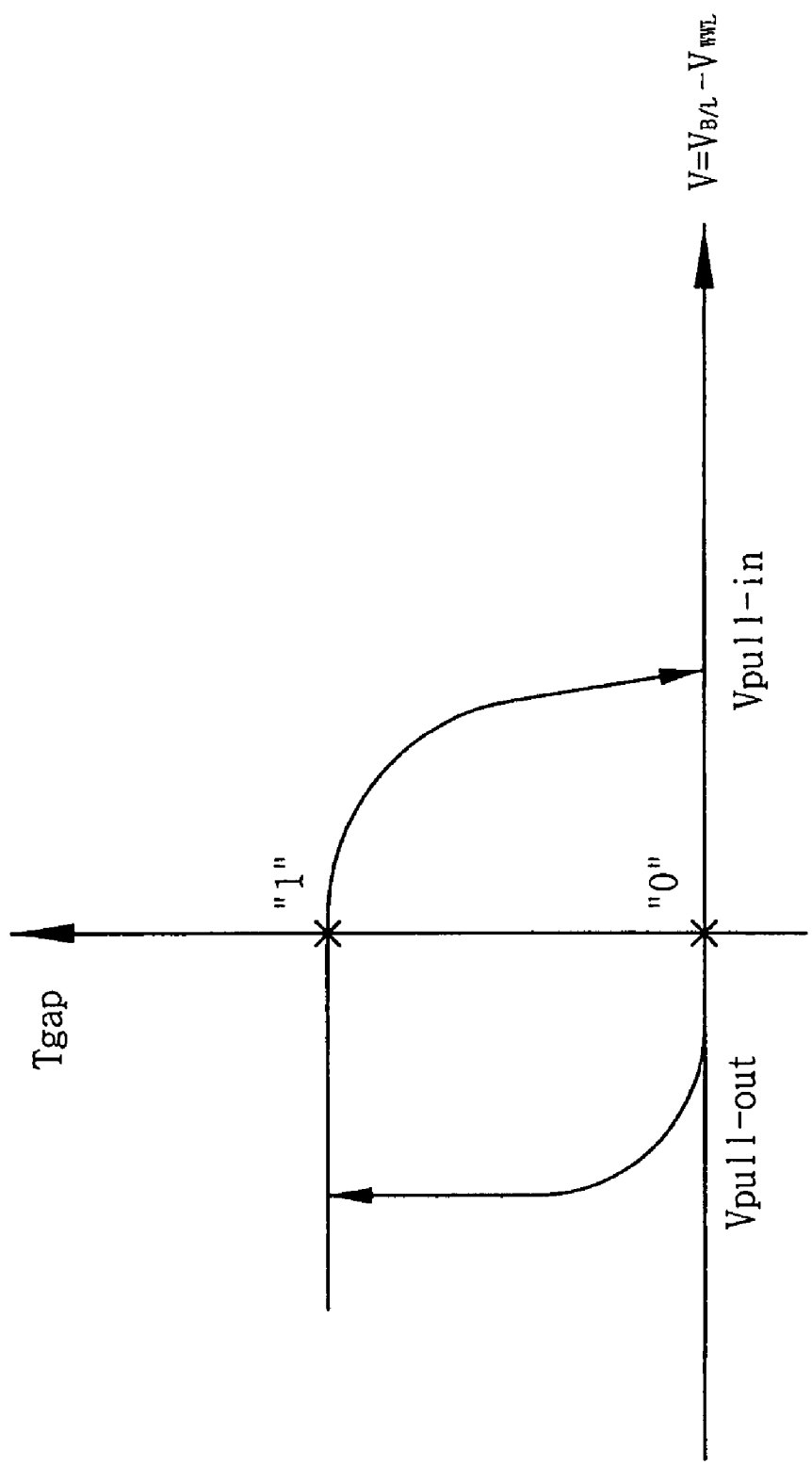
FIG. 3B is a graph of the state of the bit line electrode as a function of the applied voltage difference between voltage levels applied to the bit line $V_{BL}$ and the write word line $V_{WWL}$.

FIG. 3A is an example chart of applied voltages for performing programming, write, erase and read operations of the unit cell embodiment of FIGS. 2A-2C. FIG. 3B is a graph of the state of the bit line electrode as a function of the applied voltage difference between voltage levels applied to the bit line $V_{BL}$ and the write word line $V_{WWL}$.

Figure 5A:
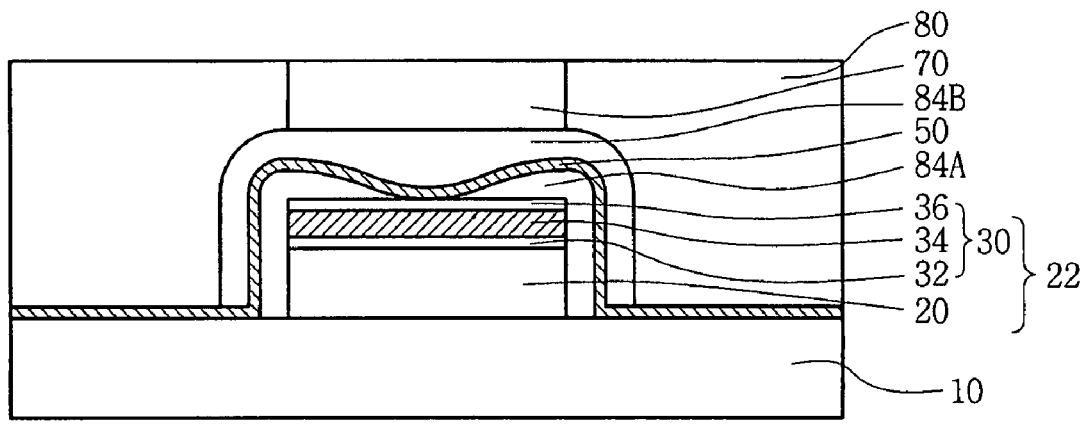
FIGS. 5A and 5B are sectional views of a unit memory cell in a second state and a read operation of the unit memory cell in the second state, for the non-volatile memory device embodiment of FIGS. 2A-2C.

With reference to FIG. 3A, in the case of the writing of a "0" state, the bit line electrode 50 is placed in a position of contact with the charge trapping structure 30 of the corresponding write word line 20. This state is shown in FIG. 5A, which is described below. To enable this, the voltage differential between the bit line $V_{BL}$ and the write word line $V_{WWL}$ is made to be a positive value. For example, $V_{BL}$=2V and $V_{WWL}$=-2V. Other lines, including the selected read word line 70, and any unselected bit lines and read and write word lines are placed in a ground or floating state. The threshold voltage of the pull-in state is 4 volts in this example, where "pull-in" refers to a position of the bit line whereby the bit line electrode 50 is in contact with the write word line 20 or corresponding charge trapping structure 30.

Figure 4A:
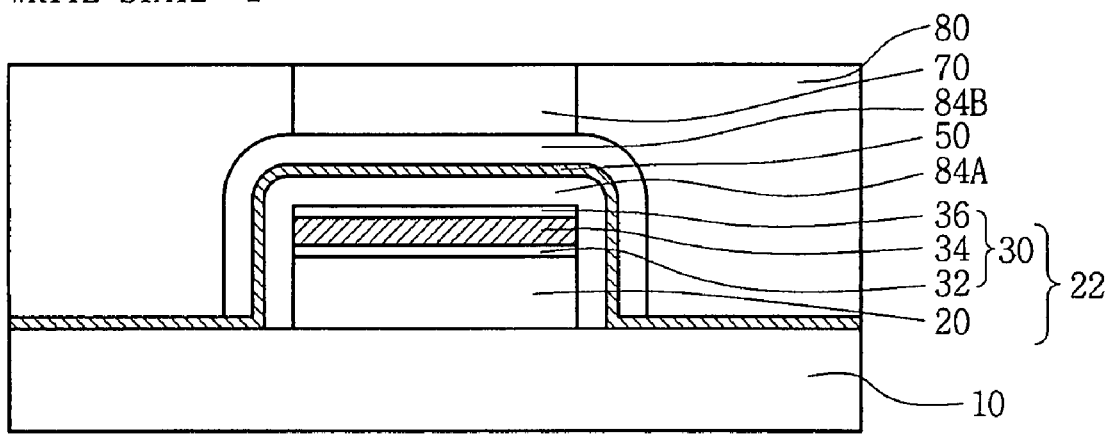
FIGS. 4A and 4B are sectional views of a unit memory cell in a first state and a read operation of the unit memory cell in the first state, for the non-volatile memory device embodiment of FIGS. 2A-2C.

In the case of the writing of a "1" state, the bit line electrode 50 is placed in a position of suspension in the gaps 84A, 84B between the underlying charge trapping structure 30 of the write word line 20 and the read word line 70. This state is shown in FIG. 4A, which is described below. To enable this, the voltage differential between the bit line $V_{BL}$ and the selected write word line $V_{WWL}$ is made to be a small positive, or small negative, value. For example, $V_{BL}$=-2V and $V_{WWL}$=0V. Other lines, including the selected read word line 40, and any unselected bit lines and read and write word lines are placed in a ground or floating state. In this case, the direction of the applied electrostatic force is in an upward direction from the write word line $V_{WWL}$ 20 to the bit line electrode 50 connected to the bit line $V_{BL}$, which restores the bit line electrode 50 from its former position, which can include a position in contact with the underlying charge trapping structure 30, to a state of suspension in the gaps 84A, 84B between the underlying charge trapping structure 30 of the selected write word line 20 and the read word line 70. The restoring force of the applied electrostatic force thus overcomes the electrostatic force, or Coulomb force, between the bit line 50 coupled to the selected bit line and the charge trapping structure 30 of the selected write word line 20.

In the case of a programming operation, all memory units are placed in a state of "0", that is, all bit line electrodes 50 in the device are placed in a position of contact with the charge trapping structure 30 of the corresponding write word lines 20. To enable this, the voltage differential between the bit lines $V_{B/L}$ and all write word lines $V_{WWL}$ is made to be a large positive value. For example, $V_{BL}$=10V and $V_{WWL}$=~-10V. In this manner, the applied electrostatic force causes the bit line electrodes 50 to come in contact with the charge trapping structure 30 of the corresponding write word lines 20, and since electrons are trapped in the charge trapping layers of the charge trapping structures, the bit line electrodes 50 are retained in the bent position by the attractive force between the bit line electrodes 50 and the charge trapping structures 30. Referring to the chart of FIG. 3A, in this example, during the programming operation, the voltage of the bit line $V_{BL}$ is set to a large positive value, represented by "++", the voltage of the write word line $V_{WWL}$ is set to a large negative value, represented by "−−", and the voltage of the read word line $V_{RWL}$ is set to an intermediate value, such as a ground voltage GND.

In the case of an erase operation, all memory units are placed in a state of "0", that is, all bit line electrodes 50 in the device are placed in a position of contact with the charge trapping structure 30 of the corresponding write word lines 20. To enable this, the voltage differential between all write word lines $V_{WWL}$ and the bit lines $V_{BL}$ is made to be a negative value. For example, $V_{BL}$=GND, $V_{RWL}$=GND and $V_{WWL}$="−", where "−" represents a moderate negative voltage. In this manner, the applied electrostatic force causes the bit line electrodes 50 to come into contact with the charge trapping structure 30 of the corresponding write word lines 20. The applied electrostatic force in this example is in a downward direction.

Thus, the programming and erase operations both result in the memory units being placed in the "0" state. The difference between the operations lies in the biasing level. In the programming operation, a large bias is applied to cause energy-band bending, and therefore Fower-Nordheim tunneling, to occur in the charge trapping structure 30, thereby trapping electrons in the charge trapping structure 30. In the erase operation, the applied bias is insufficient to cause energy band bending, which means that formerly trapped electrons do not flow from the charge trapping structure 30.

In the case of a read operation, the read word line 70 is biased with a moderate negative voltage "−", $V_{RWL}$, for example of −4V, while the other lines, including the selected write word line 20, the selected bit line 50 and the unselected bit lines and read and write word lines are placed in a ground state. This results in a voltage difference between the selected read word line 70 and the bit line electrode 50 of the selected bit line to be a positive value; thus the direction of the applied electrostatic force is in an upward direction, from the bit line electrode 50 to the read word line 70, which results in movement of the bit line electrode 50 in an upward direction toward the read word line 70, depending on the previous state of the gap between the bit line electrode 50 and the read word line 70. If the bit line electrode 50 was previously in a data "0" state, that is, in a state of contact with the underlying charge trapping layer 30 of the underlying write word line 20, then the gap between the electrode 50 and the read word line 70 is relatively large. Thus, the applied electrostatic force between the bit line electrode 50 and the read word line 70 combined with the restoring force of the bit line electrode 50, is insufficient for overcoming the attractive Coulomb force between the bit line electrode 50 and the charge trapping layer 30 of the underlying write word line 20. The bit line electrode 50 therefore remains in a downward-bent position during the read operation, as shown in FIG. 5B, and no current is sensed, resulting in a determination that the read data element is of value "0". On the other hand, if the bit line electrode 50 was previously in a data "1" state, that is in a state of suspension in the gap between the underlying charge trapping layer 30 of the underlying write word line 20 and the read word line 70, then the gap 84B between the bit line electrode 50 and the read word line 70 is relatively small. Thus, the applied electrostatic force between the electrode 50 and the read word line 70 is sufficient for placing the bit line electrode 50 in contact with the read word line 70. The bit line electrode 50 is thereby placed in an upward-bent position during the read operation, as shown in FIG. 4B, and current flow is sensed, resulting in a determination that the read operation read data element is of value "1".

FIG. 3B is a graph of the state of the electrode as a function of the applied voltage difference between voltage levels applied to the bit line $V_{BL}$ and the write word line $V_{WWL}$. When the voltage difference $V_{BL}-V_{WWL}$ is positive by a sufficient amount, the bit line electrode moves to deflect in a downward direction, and thus the gap Tgap between the electrode and the write word line becomes zero. The applied voltage that is sufficient to cause this action is referred to in FIG. 3B as the "pull-in" voltage or Vpull-in. In contrast, when the voltage difference $V_{BL}-V_{WWL}$ is negative by a sufficient amount, the electrode moves to deflect in an upward direction, and thus the gap Tgap between the bit line electrode and the write word line is present. The applied voltage that is sufficient to cause this action is referred to in FIG. 3B as the "pull-out" voltage or Vpull-out. In the graph of FIG. 3B, Vpull-in=$V_{BL}-V_{WWL}$>0, while Vpull-out=$V_{BL}-V_{WWL}$<0. Note that this chart applies to the non-volatile device example, including the charge trapping structure 30. Absent the charge trapping structure 30, for example, in the volatile device embodiment discussed in FIGS. 23-25 below, Vpull-out will lie at zero voltage or at a small, positive voltage.

In each state of "0" and "1", a Coulomb (or capacitive) force is present between oppositely biased electrodes, and a recovery force, or restoring force, is present in the bit line electrode's 50 natural propensity to restore itself to the rest position. This recovery force is related to the Young's modulus of the bit line material, among other factors.

Figure 4B:
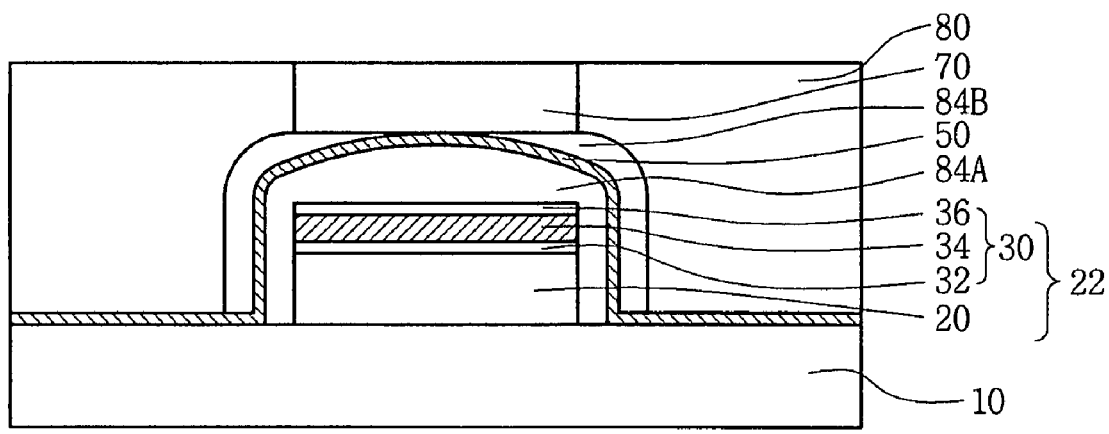
Figure 5B:
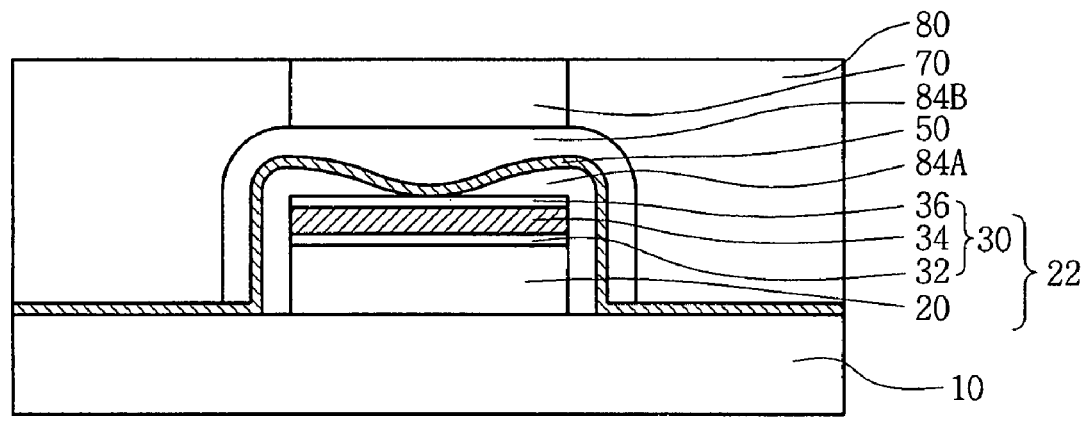

FIGS. 4A and 4B are sectional views of a unit memory cell 104 in a first state and a read operation of the unit memory cell 104 in the first state, for the non-volatile memory device embodiment of FIGS. 2A-2C.

Referring to FIG. 4A, as a result of a write operation, the bit line 50 is in a rest position, that is, in a suspended position between the charge trapping structure 30 of the write word line structure 22 and the read word line 70, and not engaging either the charge trapping structure 30 or the read word line 70. To reach this state, absent the strong biasing voltage between the bit line electrode 50 and the write word line 20, the restoring force of the bit line 50 operates to overcome the Coulomb force between the bit line 50 and the write word line 20. Accordingly, the bit line 50 is in the rest position. In one embodiment, this position of the bit line 50 corresponds with a "1" binary state for the memory cell 104; however, in another embodiment, the bit line 50 being in such a rest position could equally be considered to correspond with a "0" binary state for the memory cell 104.

In the state of "1" as shown in FIG. 4A, the bit line 50 is positioned at a suitable gap distance from the read word line 70 and remains in that position indefinitely, in a non-volatile manner, until a subsequent erase, write, or programming operation occurs, or until a read operation occurs, even with removal of applied power to the device, which removes any voltage applied to the write word line 20. During a subsequent read operation of the memory cell 104, a voltage potential is applied between the read word line 70 and the bit line 50 that is sufficient in magnitude to cause the bit line 50 to deflect from the rest position of FIG. 4A to an engaged position as shown in FIG. 4B, whereby the bit line 50 is bent in an upward direction through the upper gap 84B and such that the bit line 50 makes contact with a lower surface of the read word line 70. The suspended bit line electrode 50 is pulled in an upward direction toward the read word line 70 by the present attractive Coulomb force between the bit line 50 and the read word line 70, until they are engaged. In this engaged position, a current is generated between the read word line 70 and the bit line 50. The current is sensed by current sensing circuitry connected to the read word line of the device, which results in the read operation indicating a reading of a "1" state for the memory cell 104.

FIGS. 5A and 5B are sectional views of a unit memory cell 104 in a second state and a read operation of the unit memory cell 104 in the second state, for the non-volatile memory device embodiment of FIG. 2A-2C.

Referring to FIG. 5A, as a result of a write operation, the bit line electrode 50 is in an engaged position, whereby the bit line 50 is bent in a downward direction to make contact with an upper surface of the charge trapping structure 30 of the write word line structure 22. To reach this state, when the bit line electrode 50 is positively biased and the write word line 20 is negatively biased, such as during a programming or erase operation, the bit line electrode 50 is bent in the downward direction to contact the underlying charge trapping structure 30 because the Coulomb force present as a result of the bias overcomes the restoring force of the bit line 50. When the bias is later removed, for example, when power is removed from the device, the bit line electrode 50 remains in the bent position, because the Coulomb force is maintained by the electrons trapped in the charge trapping structure 30. In one embodiment, this position of the bit line corresponds with a "0" binary state for the memory cell 104; however, in another embodiment, the bit line 50 being in such a bent position could equally be considered to correspond with a "1" binary state for the memory cell 104.

In the state of "0" as shown in FIG. 5A, the bit line electrode 50 is bent so that it makes contact with an upper surface of the charge trapping structure 30 and remains in that position indefinitely, in a non-volatile manner, until a subsequent erase, write, or programming operation occurs. During a subsequent read operation of the memory cell 104, a voltage potential is applied between the read word line 70 and the bit line 50. A voltage potential for the read operation is selected that would have been sufficient in magnitude to cause the bit line 50 to deflect from the rest position of FIG. 4A to an engaged position with the lower surface of the read word line 70; however, the relatively small voltage potential applied between the read word line 70 and the bit line 50 for the read operation combined with the restoring force of the bit line 50 is not of sufficient magnitude so as to overcome the attractive Coulomb force between the charge trapping layer 30 and the bit line 50. As a result, during a read operation of the memory cell 104 in the state shown in FIG. 5A, the bit line 50 remains in the same position, that is, in an engaged position with an upper surface of the charge trapping structure 30 of the write word line structure 22. Thus, during the read operation, when the read operation voltage potential is applied to the read word line 70 and the bit line 50, no current is generated between the read word line 70 and the bit line 50, because the bit line 50 in the downward-bent position does not operate to close the current path between the read word line 70 and the bit line 50. The lack of current, as detected by the corresponding current sensing circuitry, results in the read operation indicating a reading of a "0" state for the memory cell 104.

Upon initial programming of the device, the high-bias condition provides the charge trapping structures 30 with tunneling of electrons, through Fower-Nordheim tunneling. No further programming is required since the trapped electrons permanently occupy the charge trapping structure 30; thus, no further high-bias operation is needed. Transition between the "1" and "0" states is achieved by moderate biasing of the write word line 20 and the bit line electrode 50; a moderate bias level that does not result in further Fower-Nordheim tunneling. As a result, the device is operable at moderate power levels, leading to high energy efficiency.

To ensure accurate and reliable programming, reading, writing, and erase operations in a device, the elasticity of the bit line electrode 50, the width of the lower and upper gaps 84A, 84B and the magnitude and polarity of the applied voltages are considered. For example, the elasticity of the bit line electrode 50 is dependent at least in part, on the respective lengths of the first and second portions 51, 52 of the bit line 50, the thickness of the bit line 50, and the material properties of the bit line 50. The upper and lower gap widths 84A, 84B, or distances, affect on the amount of travel of the bit line 50 between a position of engagement with the read word line 70, a rest position, and a position of engagement with the charge trapping structure 30 of the write word line structure 22. The gap distances affect the voltage levels that are required for moving the bit line 50 between its various engaging and rest positions. The upper and lower gap distances 84A, 84B can be the same, or different, depending on the application. Elasticity of the bit line 50 material affects the resilience of the bit line 50, and its propensity to return to the rest position, as well as the lifespan of the bit line 50 over many cycles of write and read operations. Tradeoffs between each of these factors, and other factors, will contribute to the operating speed, operating voltages, and reliability of the resulting device.

FIGS. 6A-14A are perspective views of a method for forming an electromechanical non-volatile memory device in accordance with an embodiment of the present invention. FIGS. 6B-14B are sectional views taken along section lines I-I' of FIGS. 6A-14A respectively. FIGS. 6C-14C are sectional views taken along section lines II-II' of FIGS. 6A-14A respectively.

Figure 6A:
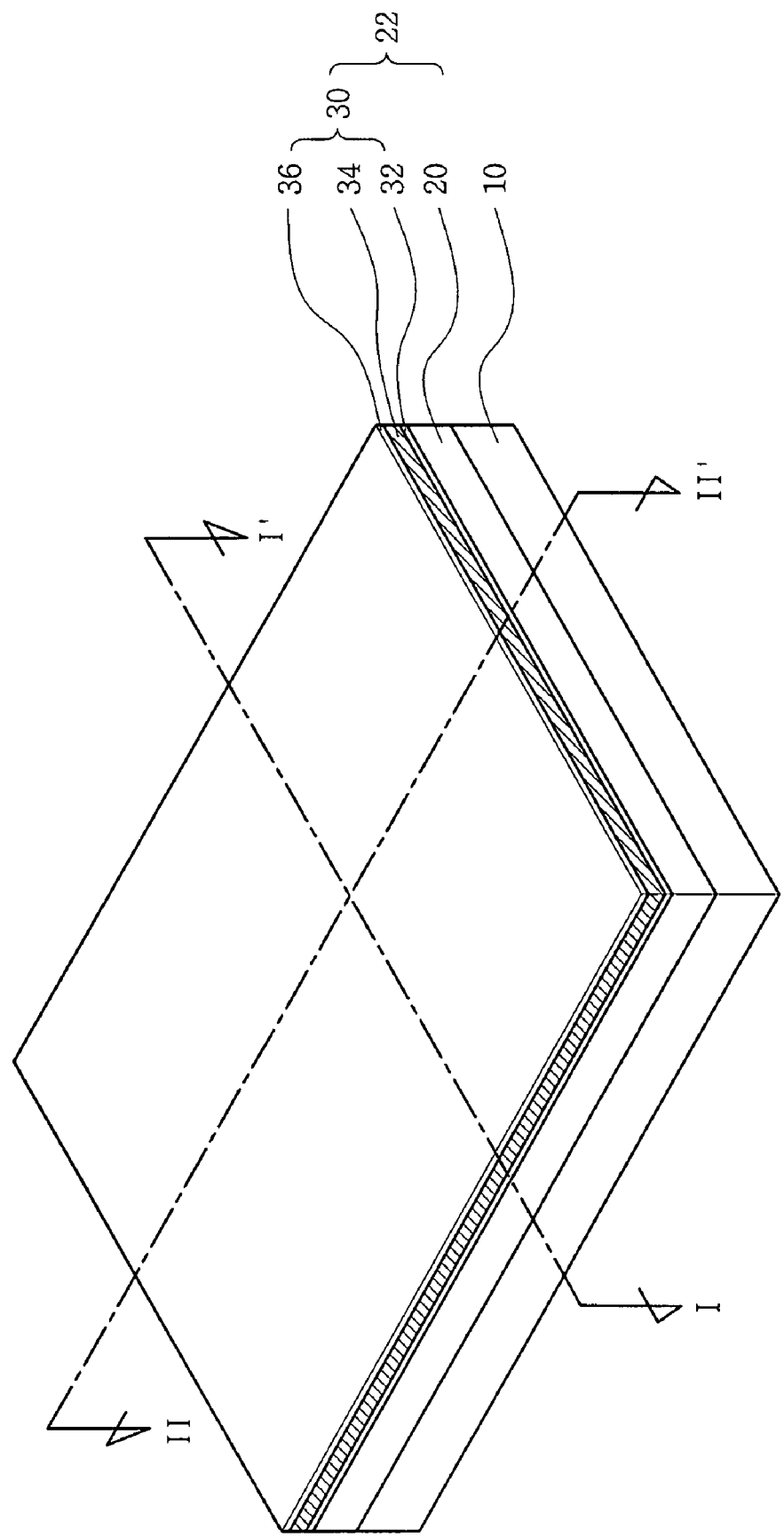
Figure 6B:
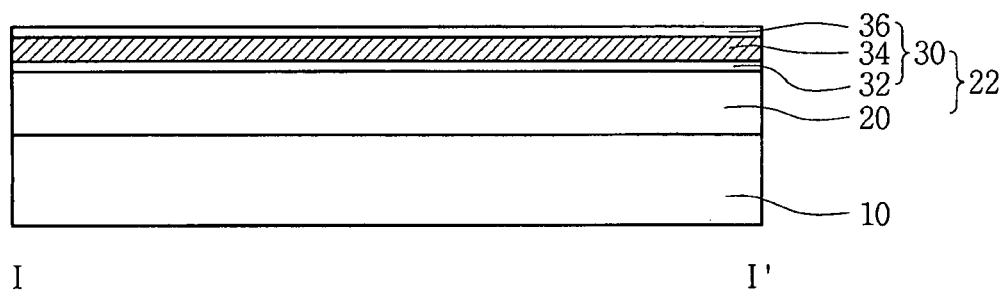
Figure 6C:
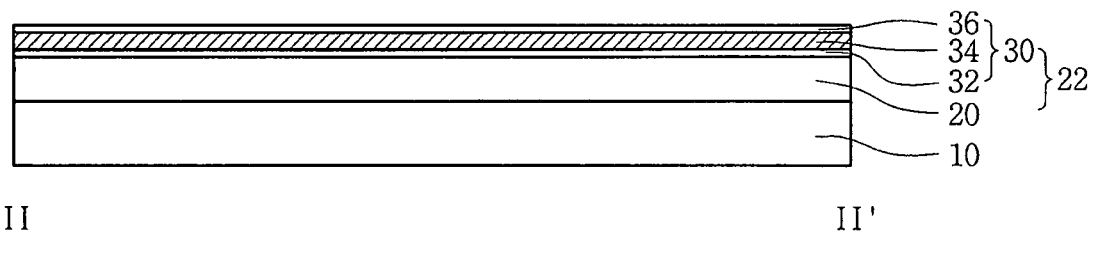

Referring to FIGS. 6A-6C, a lower word line layer 20, in this case, a write word line layer, is provided on an insulator (not shown) that is formed on a substrate 10 and a charge trapping structure layer 30 is formed on the lower word line layer 20. The substrate 10 can comprise, for example, a semiconductor material, such as bulk silicon. Alternatively, the substrate 10 can comprise a silicon-on-insulator (SOI) structure or a flexible insulation layer that is applied to an underlying bulk structure for support.

The write word line layer 20 can comprise, for example, a conductive material such as gold, silver, copper, aluminum, tungsten, titanium nitride, polysilicon or any other suitable conductive material that can be patterned to form the word lines 20. The charge trapping layer structure 30 comprises a suitable charge trapping structure, including, for example, a multiple layered oxide/nitride/oxide (ONO) structure including a tunnel oxide layer 32 formed by thermal oxidation, a nitride layer 34 formed by chemical vapor deposition (CVD) and a blocking oxide layer 36, formed by CVD or atomic layer deposition (ALD). Other suitable charge trapping structure materials such as oxide/nitride/alumina (ONA) are equally applicable to the devices and methods of formation of the embodiments of the present invention. In one embodiment, the write word line layer 20 comprises a conductive metal layer, such as $WSi_2$, formed to a thickness of about 30-50 nm using a CVD process; and the charge trapping layer 30 comprises oxide/nitride/oxide (ONO) layers formed to respective thicknesses of about 10 nm/20 nm/10 nm.

An optional transition layer can be present between the write word line layer 20 and the charge trapping layer structure 30. The optional transition layer can be applied to maintain suitable properties in the tunnel oxide layer 32.

Figure 7A:
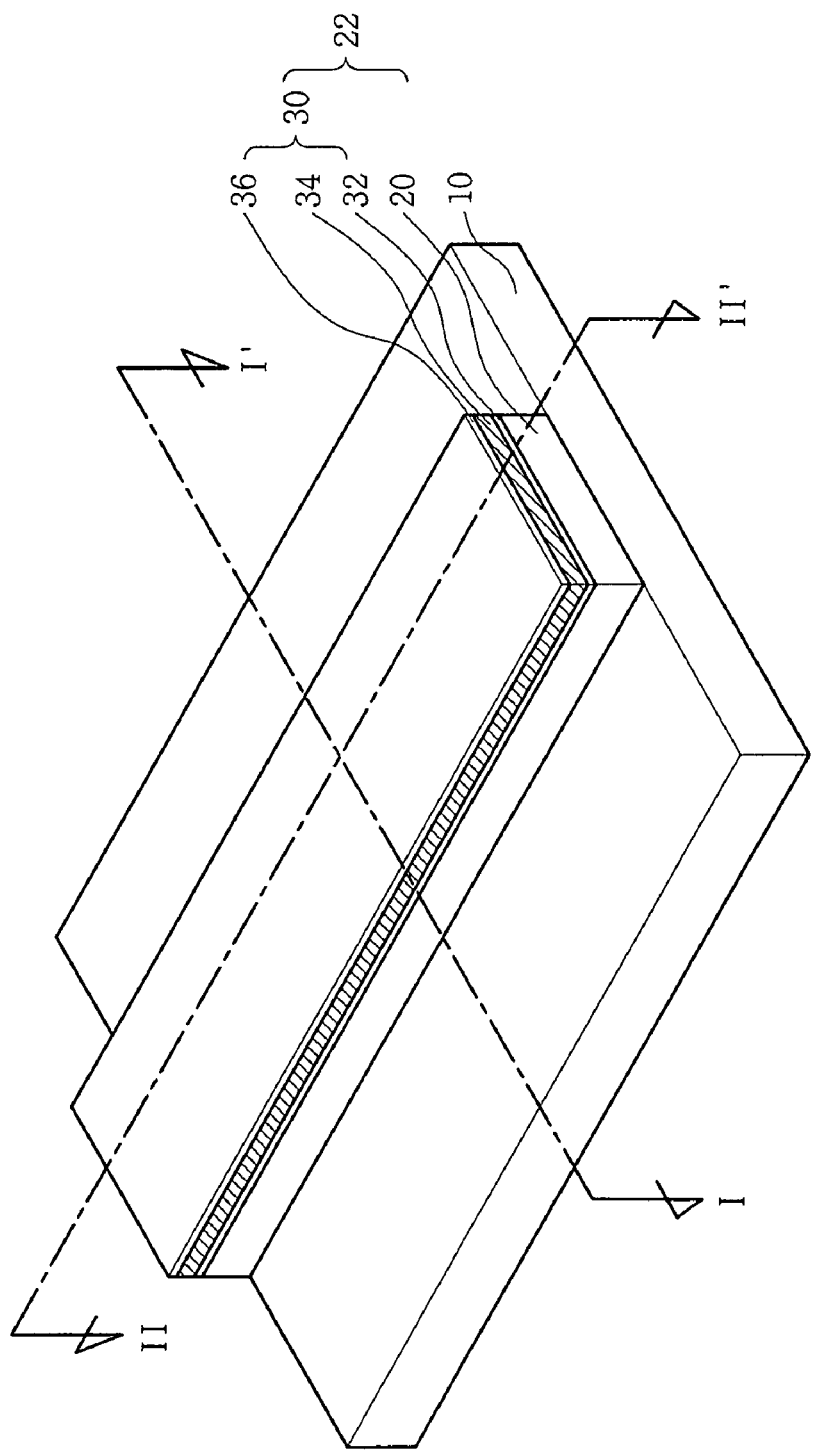
Figure 7B:
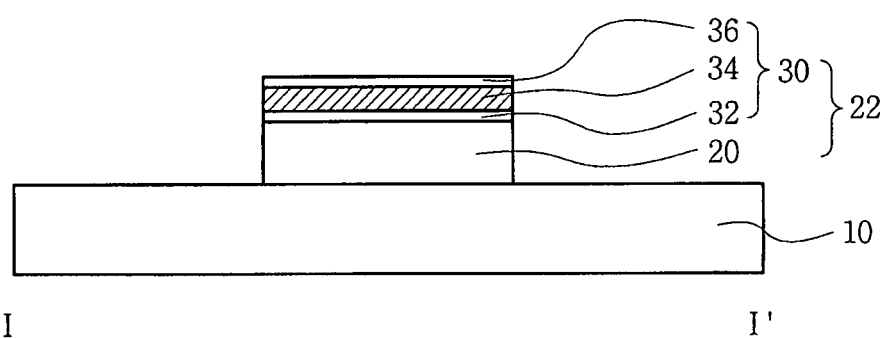
Figure 7C:
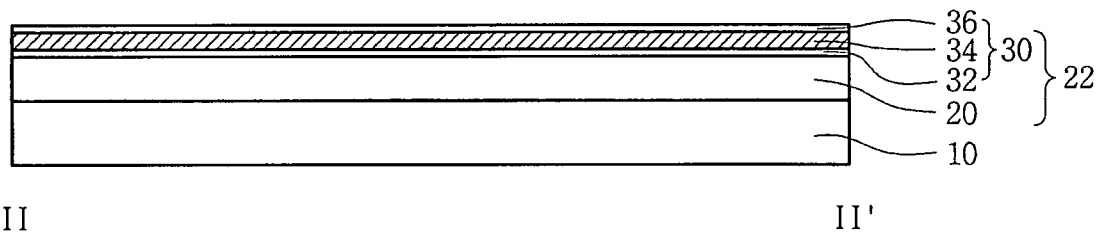

Referring to FIGS. 7A-7C, the write word line layer 20, and the charge trapping layer structure 30 are patterned using standard photolithography techniques to form a write word line 20 and a charge trapping structure 30. In one embodiment, the stated layers are patterned at the same time, using the same photomask. The resulting write word line 20 and charge trapping structure 30 extend on the substrate in a first direction.

Figure 8A:
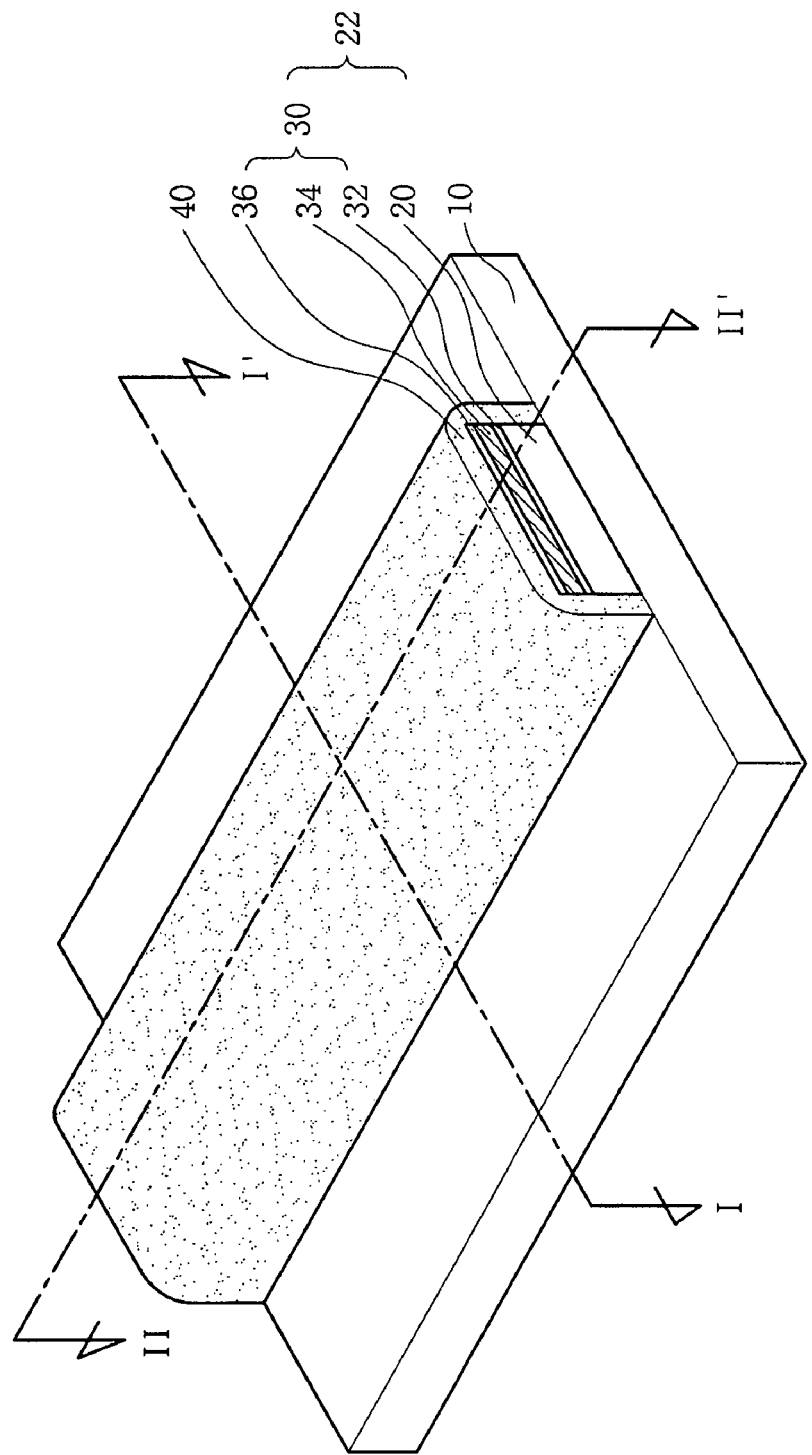
Figure 8B:
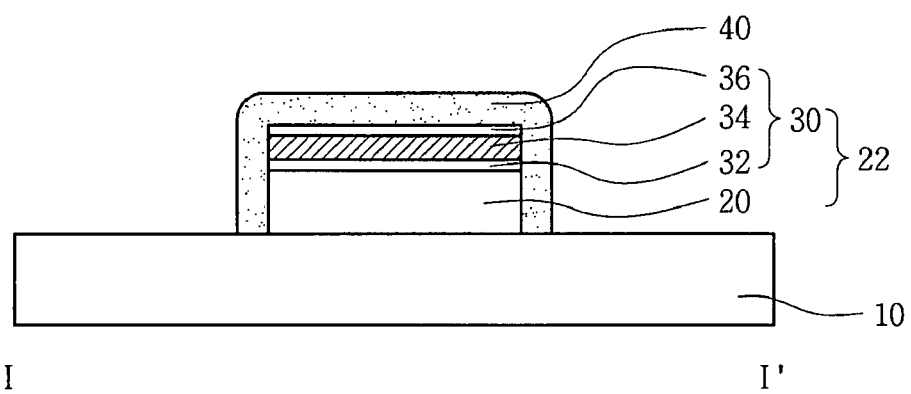
Figure 8C:
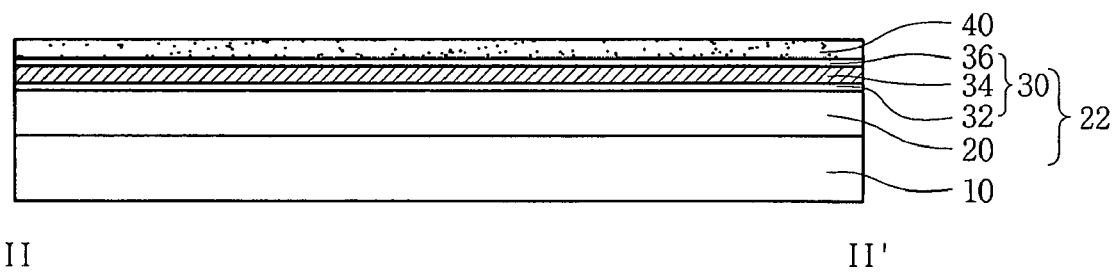

Referring to FIGS. 8A-8C, a first sacrificial layer 40 is formed and patterned on the top and sidewalls of the write word line 20 and charge trapping structure 30. The first sacrificial layer 40 is formed, for example, of polysilicon, nitride or oxide, using a CVD process to a thickness of about 10-300 angstroms, and is patterned, for example, using standard photolithography techniques or by using a hard mask that is removed following patterning of the first sacrificial layer 40.

Figure 9A:
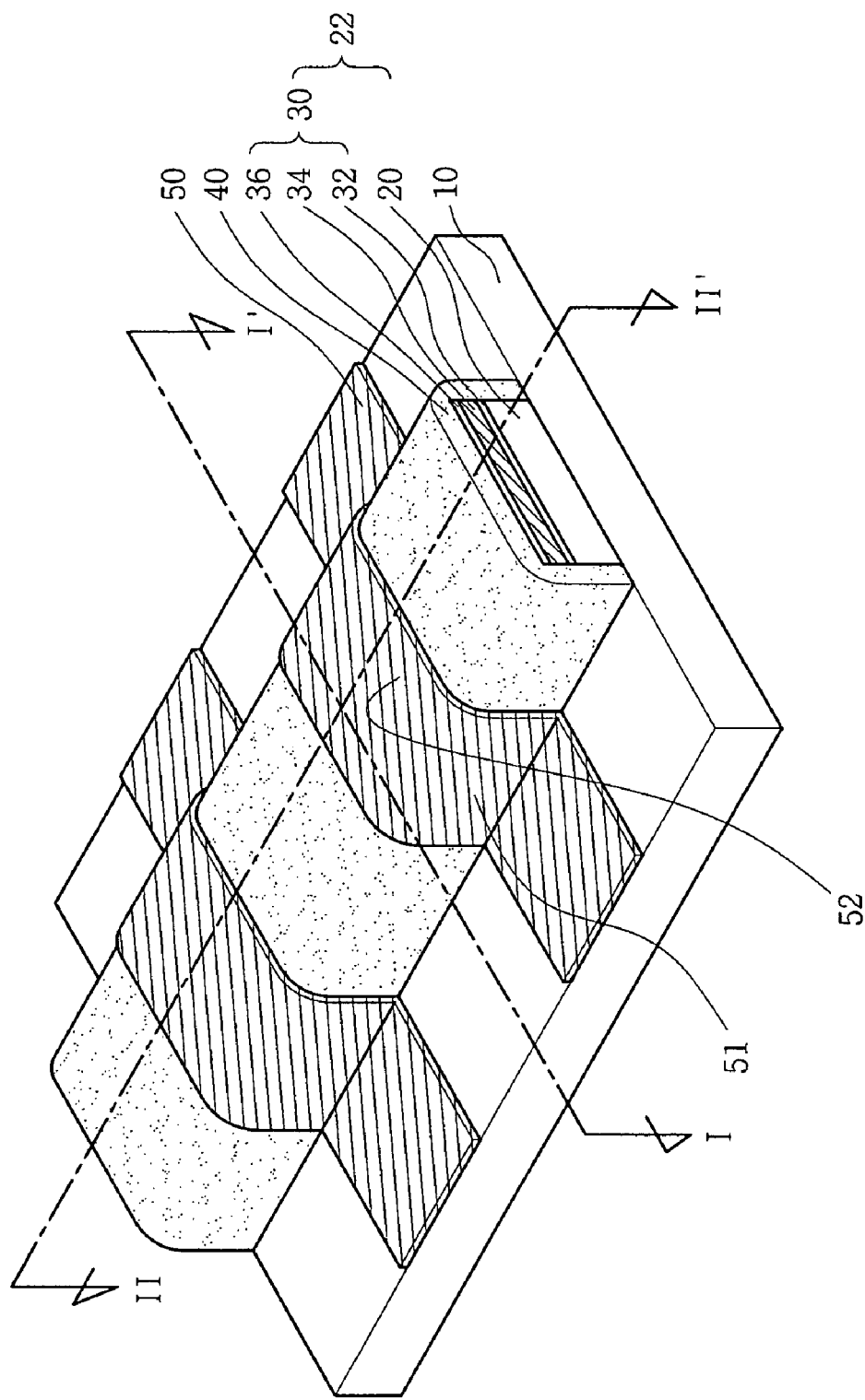
Figure 9B:
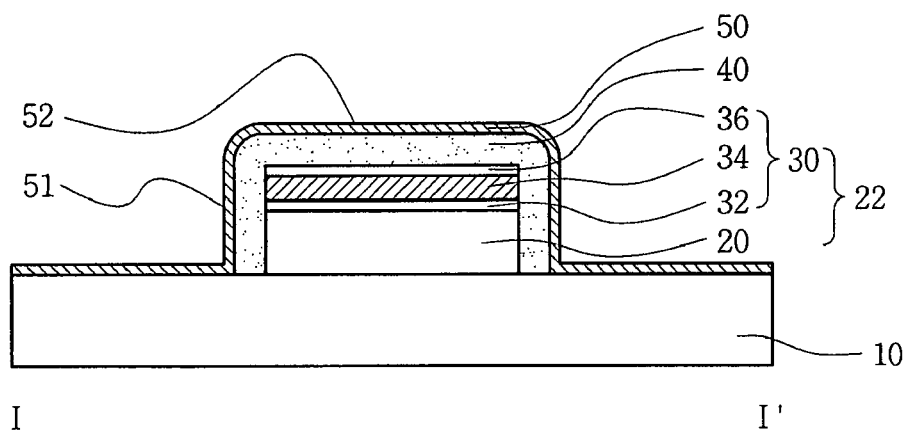
Figure 9C:
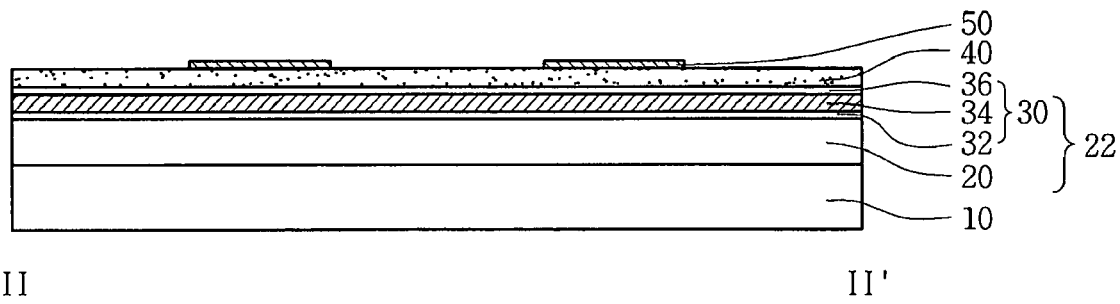

Referring to FIGS. 9A-9C, a bit line layer is formed and patterned to form a plurality of bit lines 50 on the insulator layer (not shown) on the substrate 10 and on the first sacrificial layer 40 The bit lines 50 extend on the substrate in a second direction that is transverse the first direction of extension of the write word lines 20, so as to intersect the write word lines 20. The bit lines can comprise, for example, a conductive material such as gold, silver, copper, aluminum, tungsten, titanium nitride, polysilicon or any other suitable conductive material that can be patterned to form the bit lines 20. The bit lines can further comprise nanotube structures of the type disclosed in United States Application Publication No. 2004/0181630, incorporated by reference above. In one embodiment, the bit line layer comprises TiN material, formed to a thickness ranging between about 5 nm and 30 nm, and, in one embodiment, 20 nm, and is patterned using a polysilicon hard mask that is removed following patterning.

The bit lines 50 each include a first portion 52 that extends generally in a horizontal direction, parallel to an upper surface of the substrate 10, and second portions 51 that extend generally in a vertical direction relative to the substrate 10. In this manner, each bit line 50 forms an arch-shaped structure that is suspended over, and spaced apart from, the underlying, intersecting, lower word line structure 22.

Figure 10A:
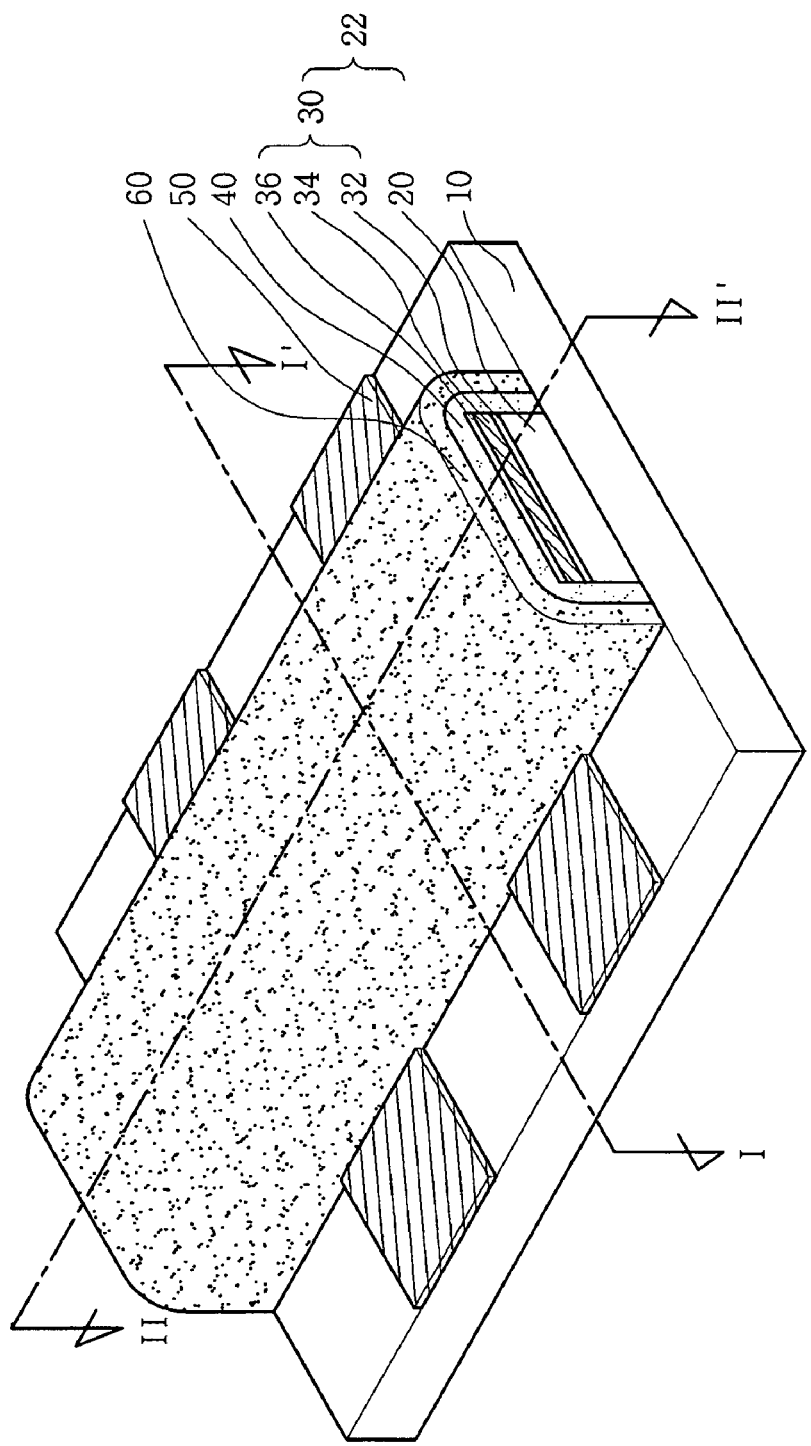
Figure 10B:
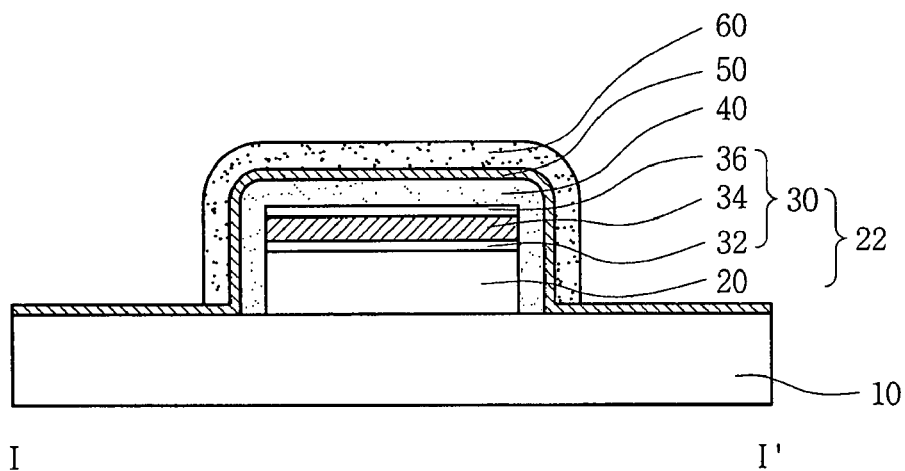
Figure 10C:
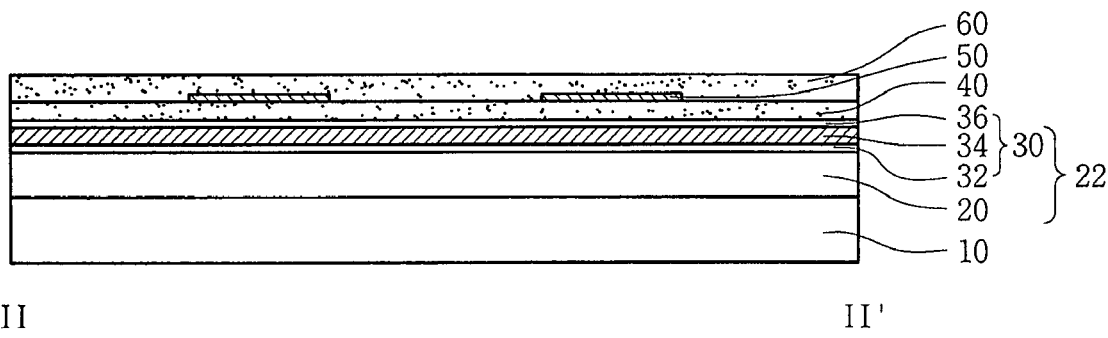

Referring to FIGS. 10A-10C, a second sacrificial layer 60 is formed and patterned on the top and sidewalls of the first sacrificial layer 40 and on the first and second portions 52, 51 of the bit lines 50. The second sacrificial layer 60 is formed, for example, of polysilicon, nitride or oxide, using a CVD process, to a thickness of about 10-300 angstroms, and is patterned, for example, using standard photolithography techniques or by using a hard mask that is removed following patterning of the second sacrificial layer 60.

Figure 11A:
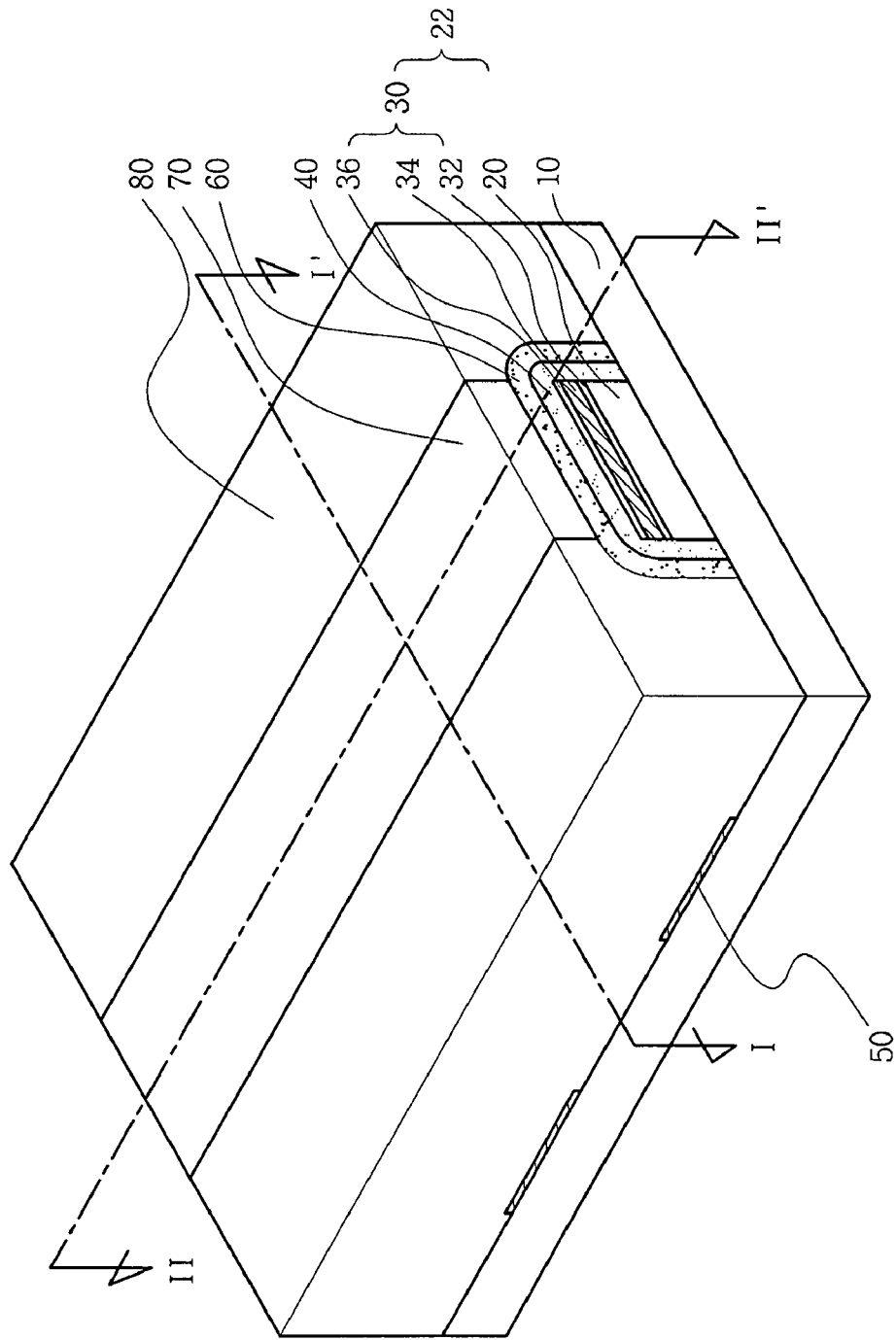
Figure 11B:
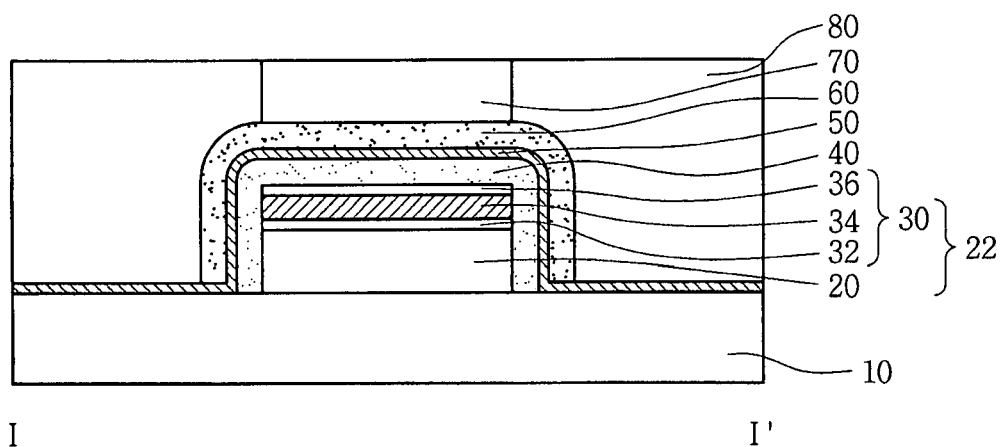
Figure 11C:
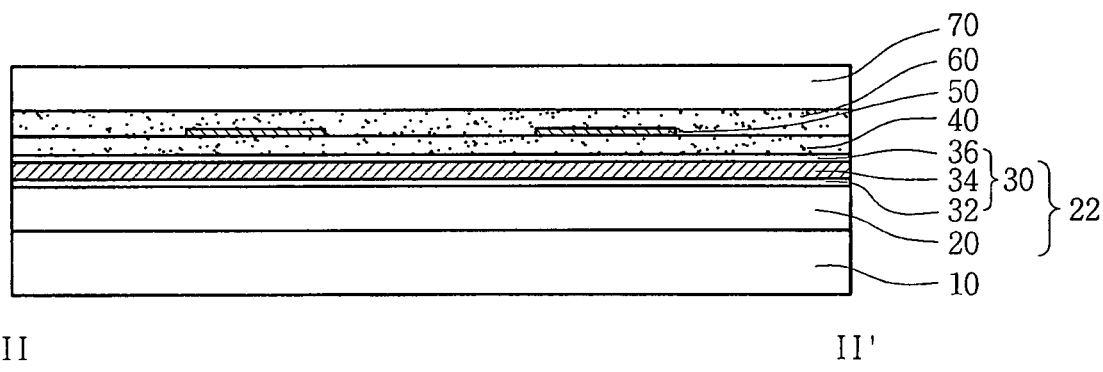

Referring to FIGS. 11A-11C, a read word line 70 is formed and patterned on the second sacrificial layer 60. The read word line 70 can comprise, for example, a conductive material such as gold, silver, copper, aluminum, tungsten, titanium nitride, polysilicon or any other suitable conductive material that can be patterned to form the read word line 70. In one embodiment, the read word line 70 comprises a conductive metal layer, such as $WSi_2$, formed to a thickness of about 50 mm using a CVD process. The read word line 70 is formed above the write word line 20 and, like the write word line 20, extends in the first direction on the substrate, intersecting the bit lines 50. In the embodiment shown, the read word line 70 is of a width that that about the same as that of the underlying write word line structure 22; however, the respective widths may be different, depending on the application.

A first interlayer dielectric layer 80 is applied to the resulting structure, for example using chemical vapor deposition (CVD) of an insulative material, such as silicon oxide, to cover the resulting structure. In one embodiment, chemical-mechanical polishing is then performed to remove an upper portion of the first interlayer dielectric layer 80 to expose an upper portion of the read word line 70. In one embodiment, the first interlayer dielectric layer 80 comprises silicon oxide, formed to a thickness of about 150 nm.

In an alternative embodiment, the read word line 70 can be formed using a damascene process whereby the first interlayer dielectric layer 80 is initially formed, and a trench that defines the position of the read word line 70 is subsequently formed in the interlayer dielectric layer 80 to expose an upper surface of the second sacrificial layer 60. The read word line layer is then applied in the trench and on the first interlayer dielectric layer, and then the read word line layer is planarized to form the separated read word lines 70.

Figure 12A:
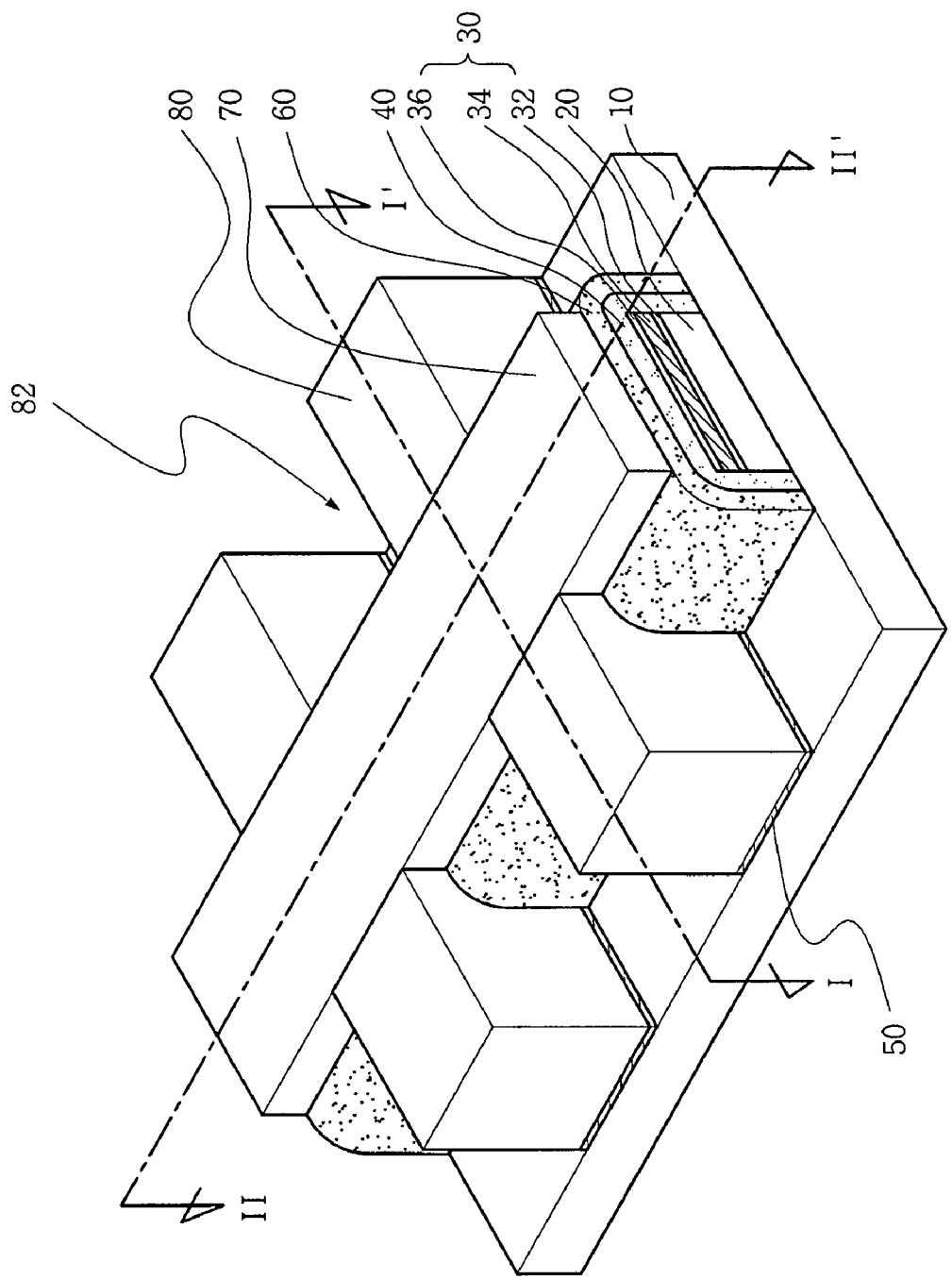
Figure 12B:
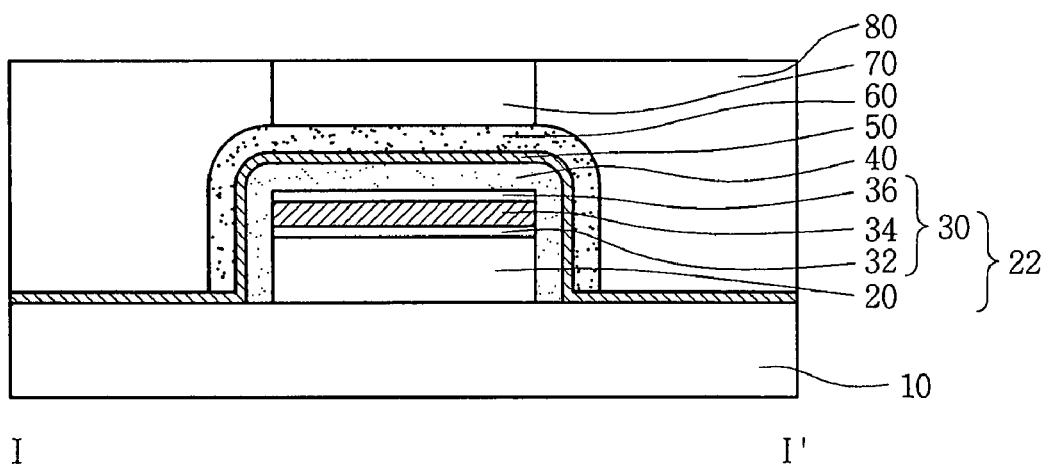
Figure 12C:
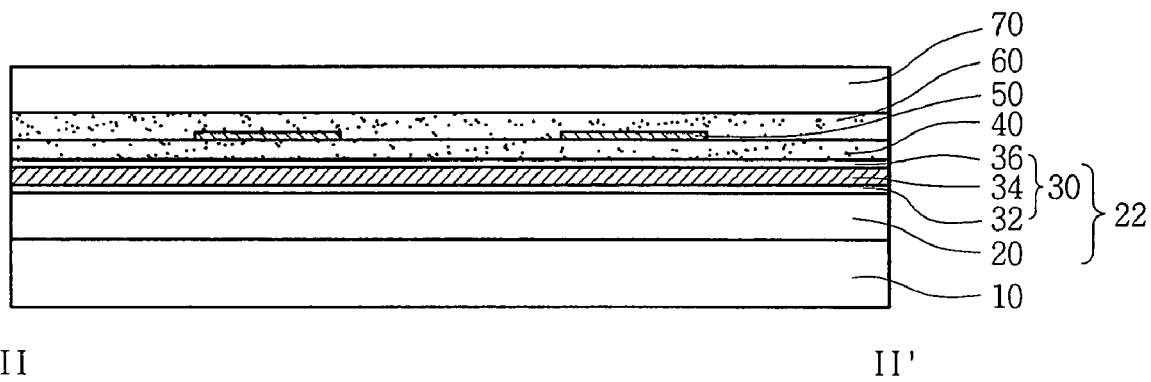

Referring to FIGS. 12A-12C, trenches 82 are formed in the first interlayer dielectric layer 80 between the bit lines 50 by selectively patterning the interlayer dielectric layer 80 to remove only those portions that do not lie above the bit lines 20. This exposes portions of the second sacrificial layer 60 that lie between the bit lines 50.

Figure 13A:
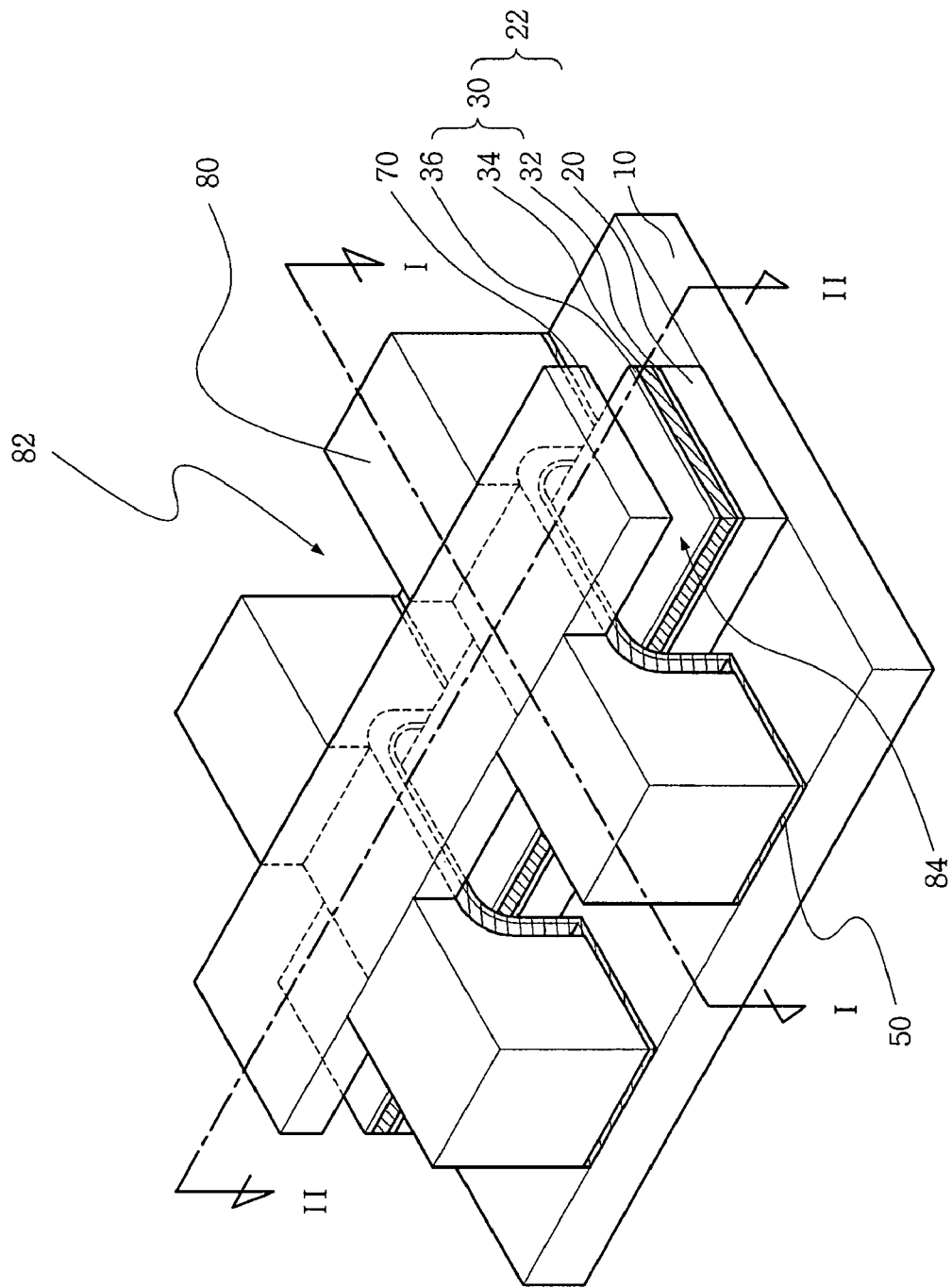
Figure 13B:
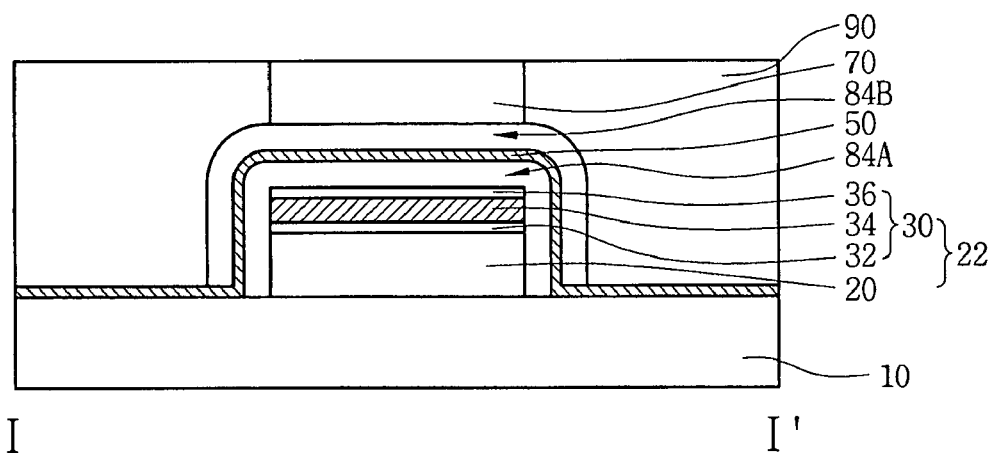
Figure 13C:
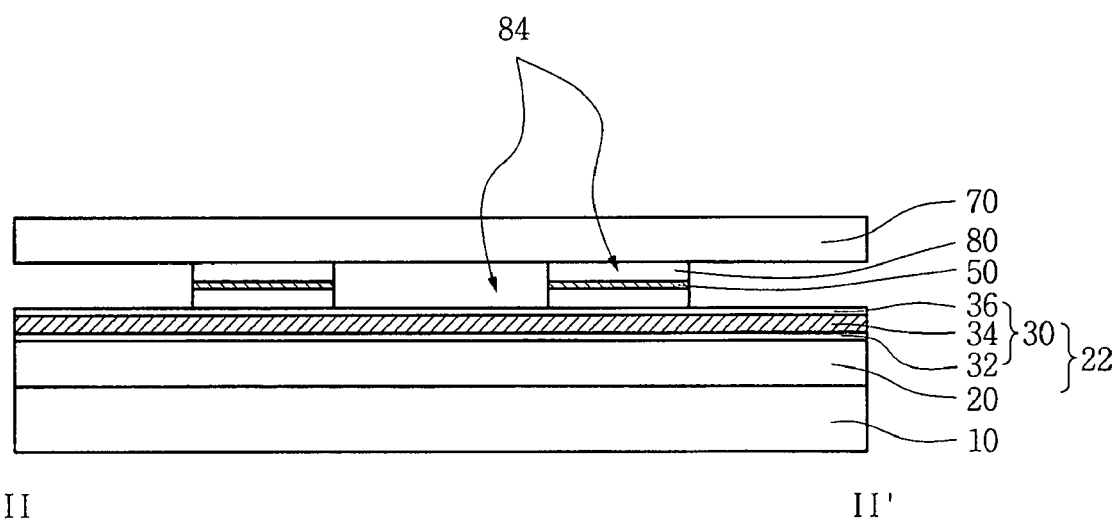

Referring to FIGS. 13A-13C, the first sacrificial layer 40 and the second sacrificial layer 60, are removed using a wet etching process or a chemical dry etch (CDE) process. Removal of the second sacrificial layer 60 undermines the read word line 70, and, as a result, an upper gap 84B is formed between the read word line 70 and the bit line 50. The upper gap 84B also extends between the interlayer dielectric layer 80 and the bit line 50. Removal of the first sacrificial layer 40 undermines the bit line 50, and, as a result, a lower gap 84A is formed between the bit line 50 and the write word line structure 22, including the charge trapping structure 30 and the write word line 20. The lower gap 84B also extends between bit line 50 and the sidewalls of the charge trapping structure 30 and the write word line 20. The thicknesses of the applied first and second sacrificial layers 40, 60 thus define the resulting first and second gap distances 84A, 84B.

Figure 14A:
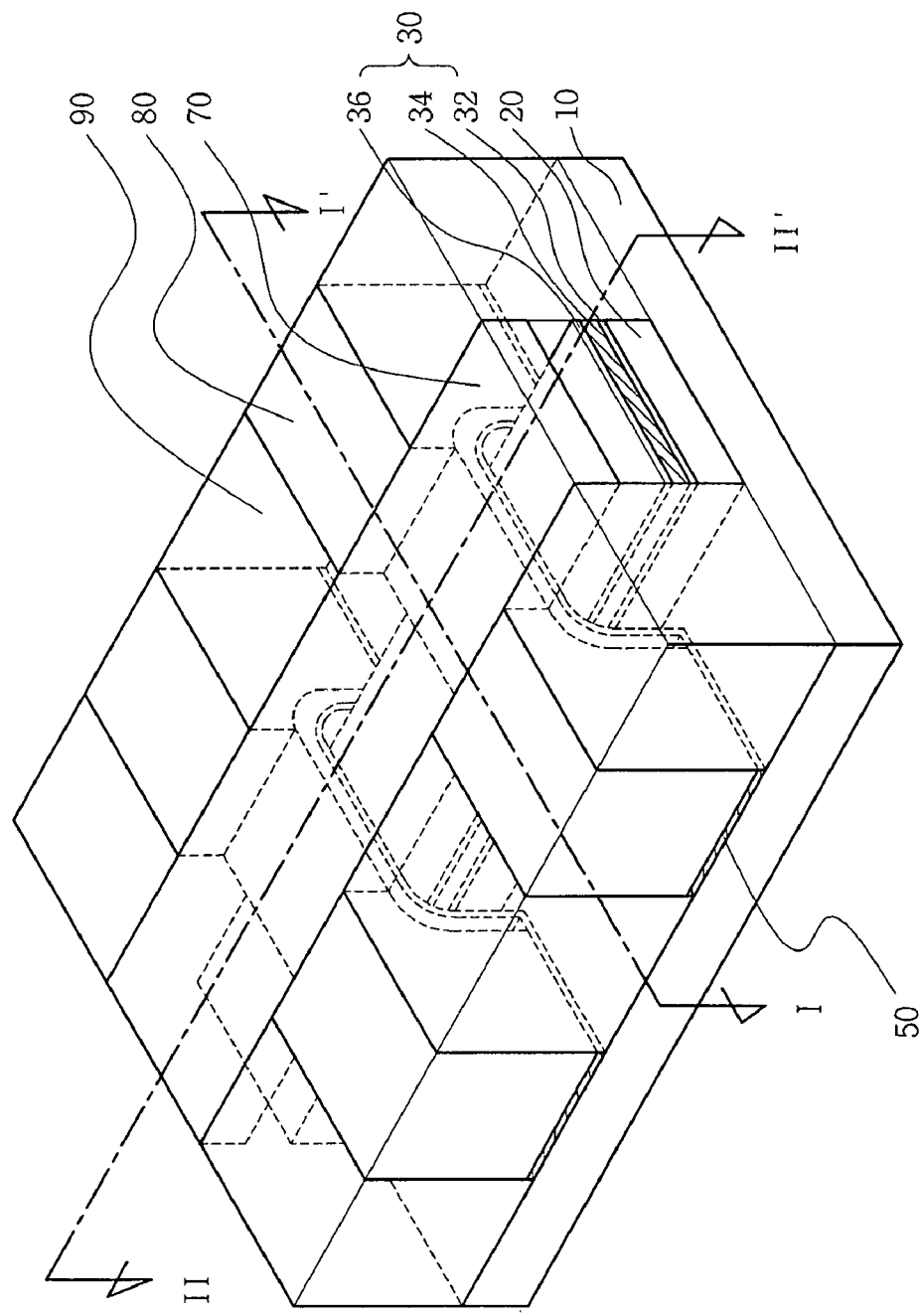
Figure 14B:
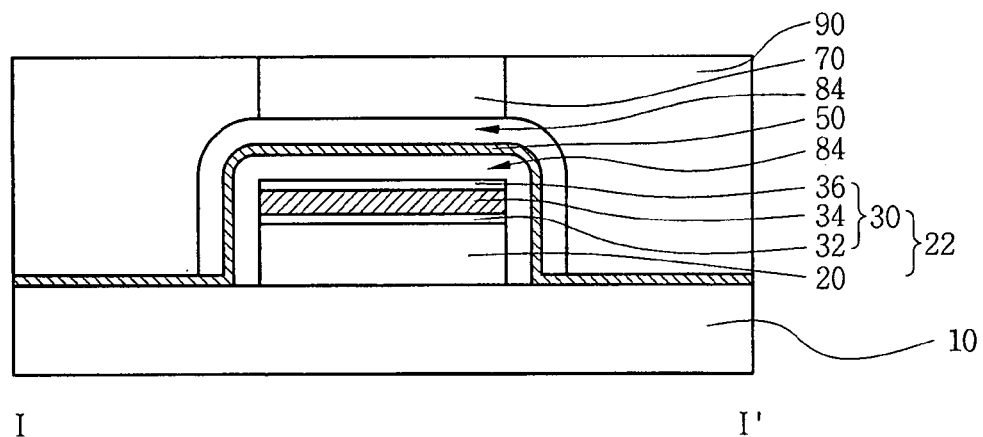
Figure 14C:
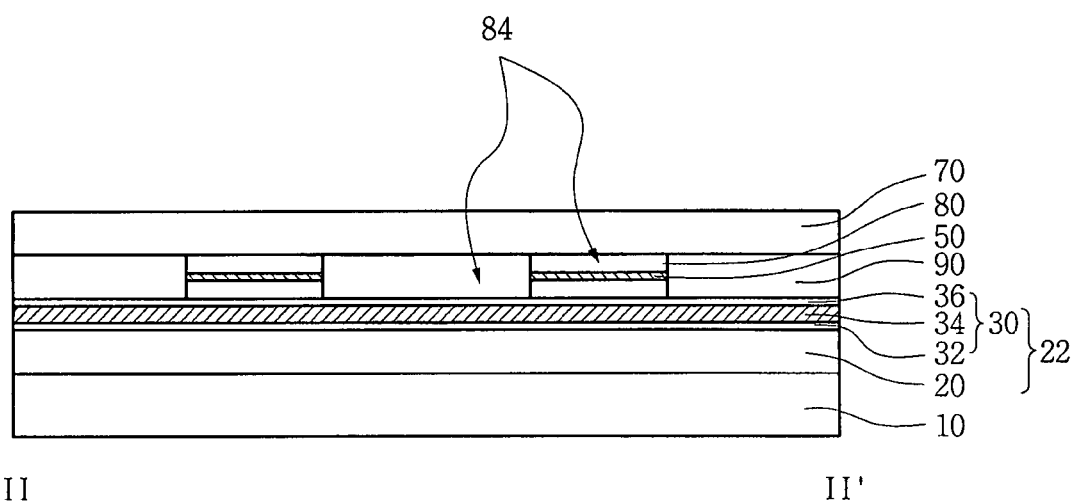
Figure 15A:
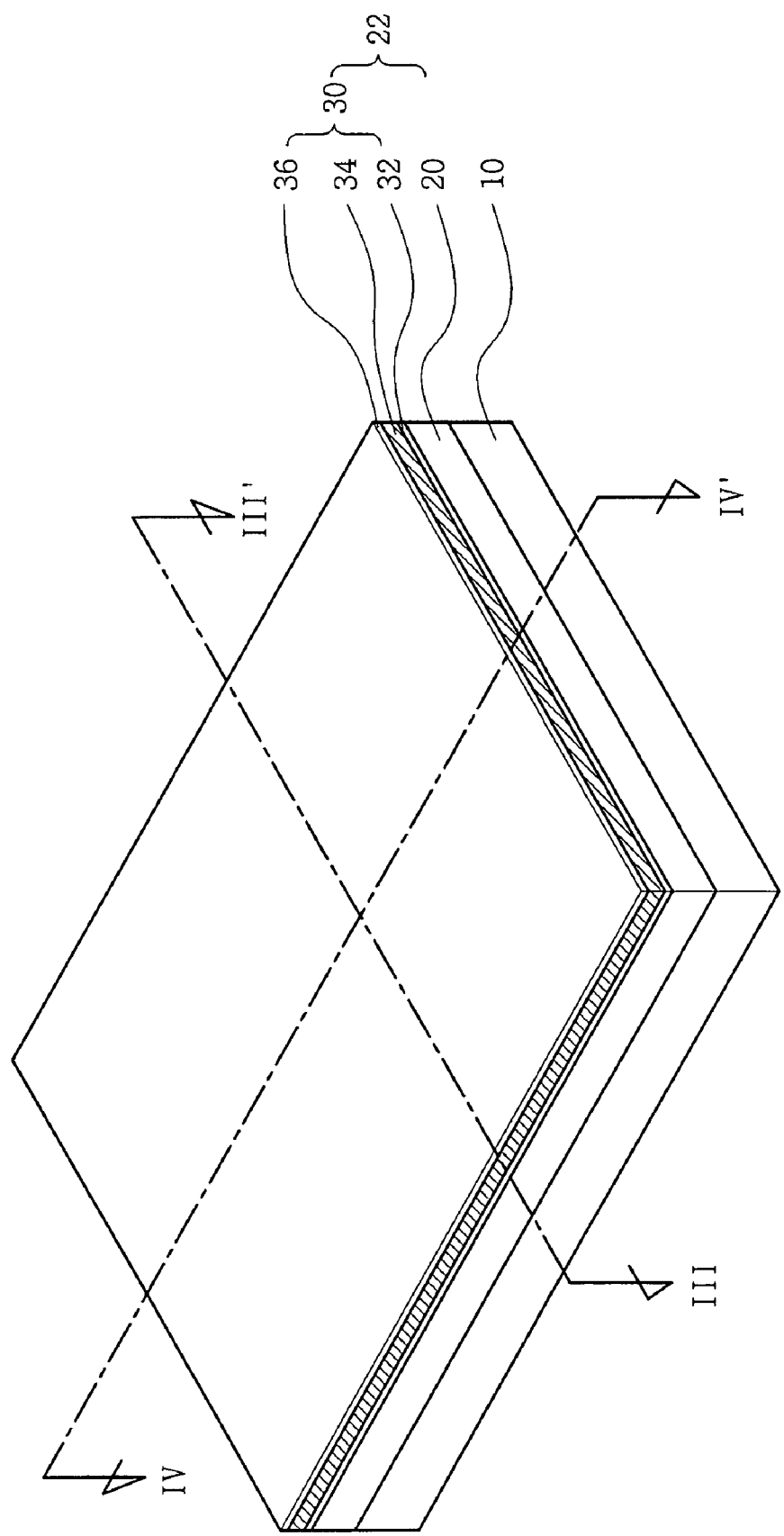
Figure 15B:
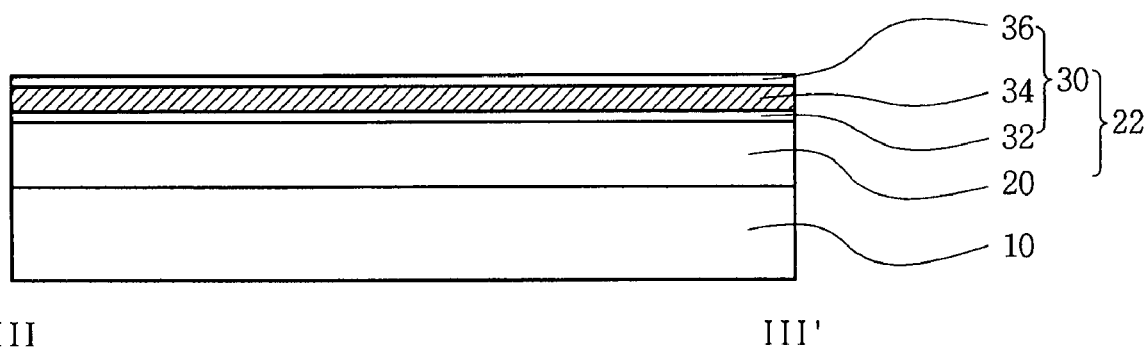
Figure 15C:
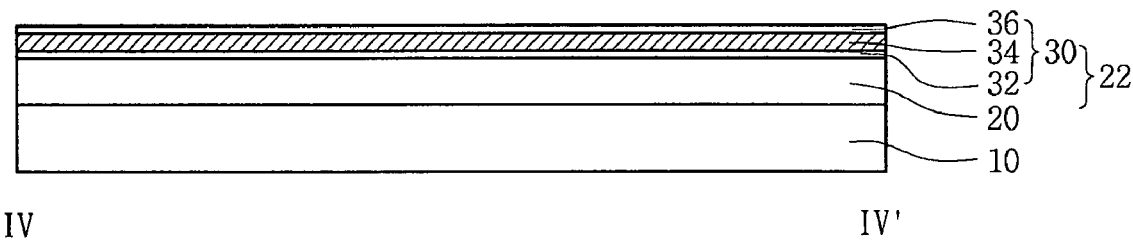
Figure 16A:
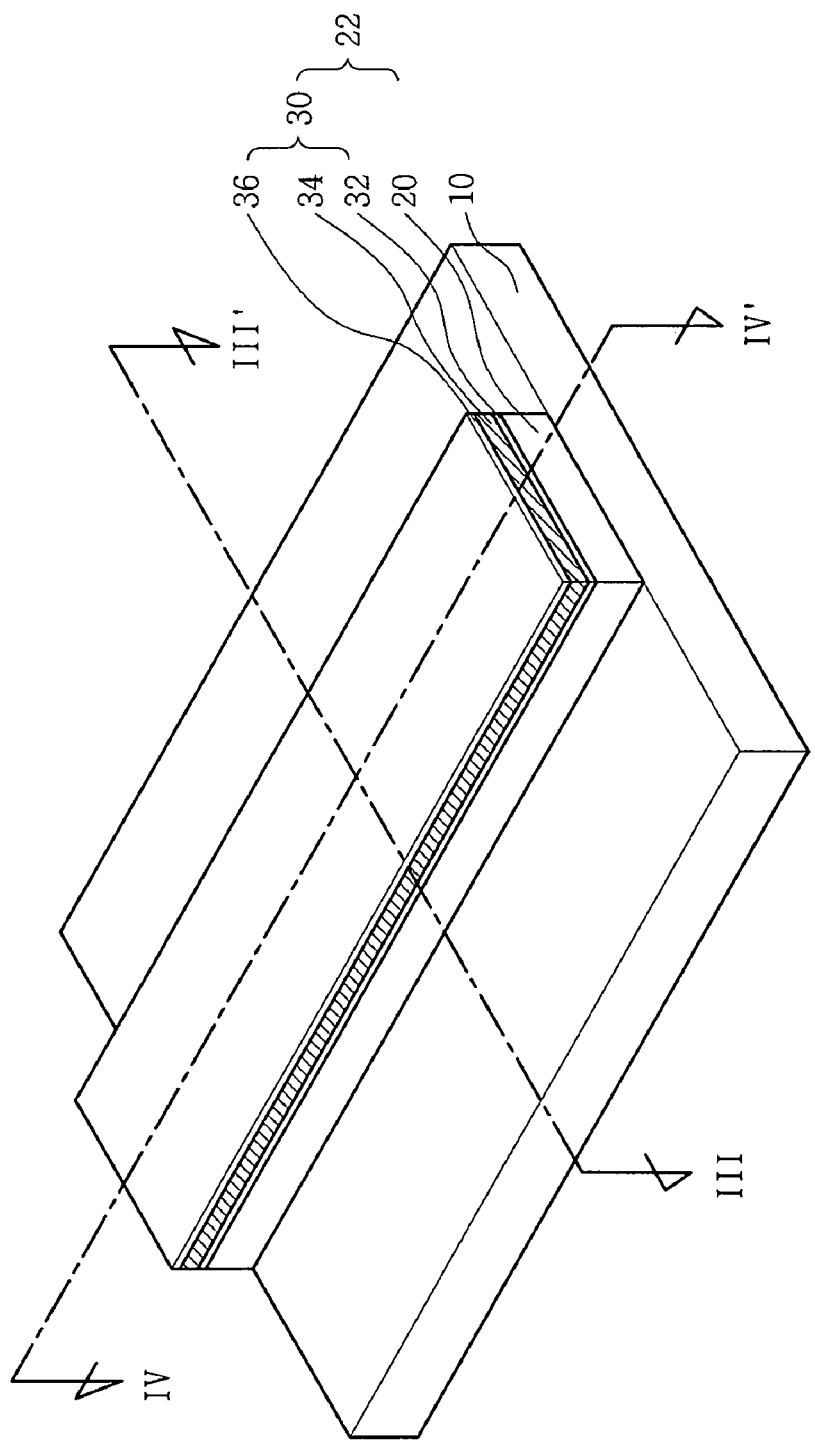
Figure 16B:
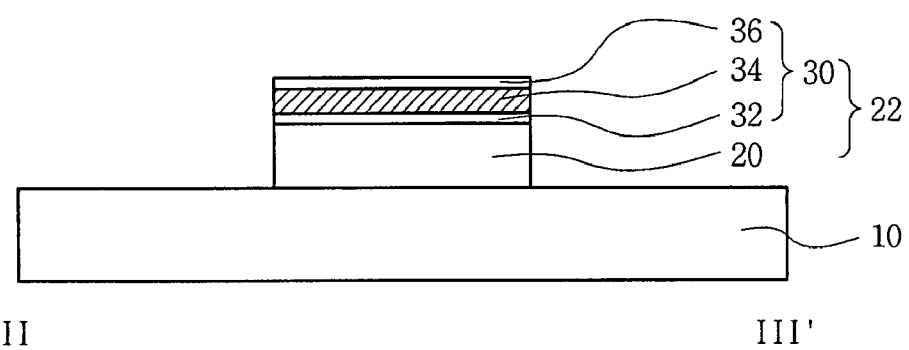
Figure 16C:
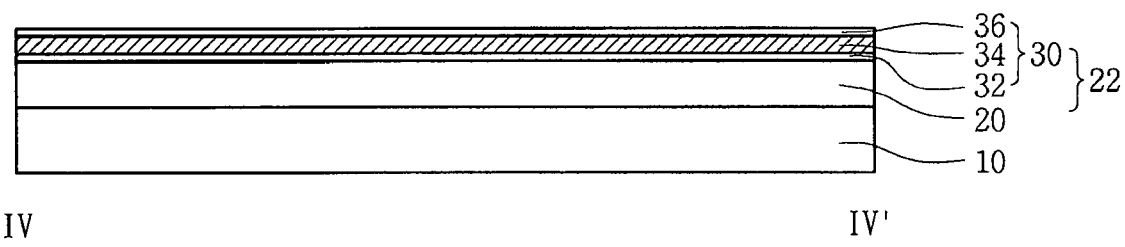
Figure 17A:
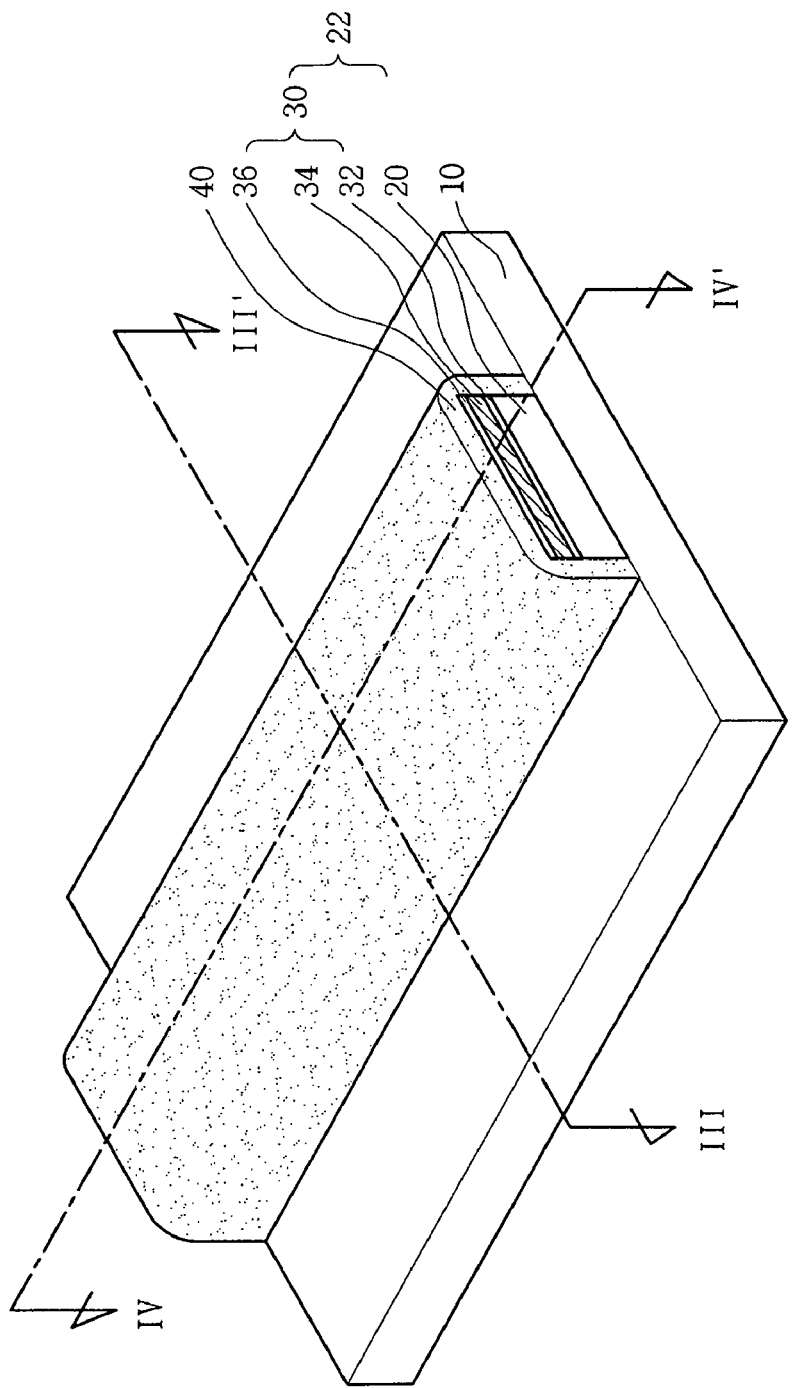
Figure 17B:
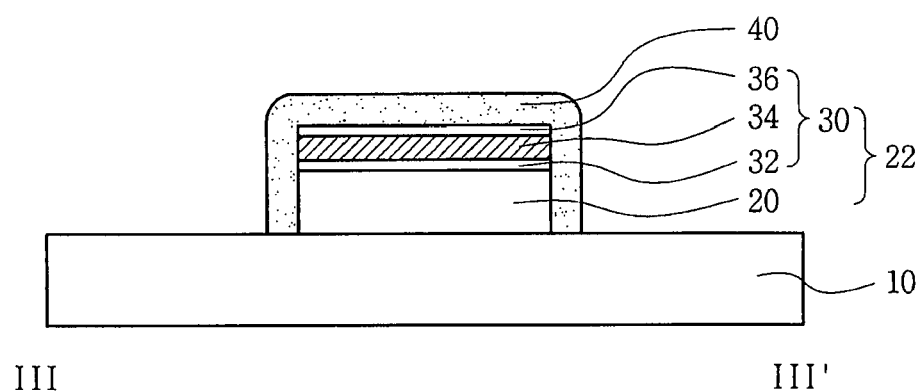
Figure 17C:
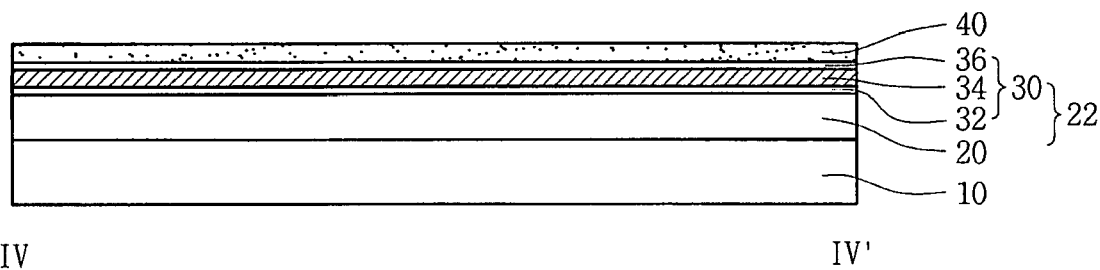
Figure 18A:
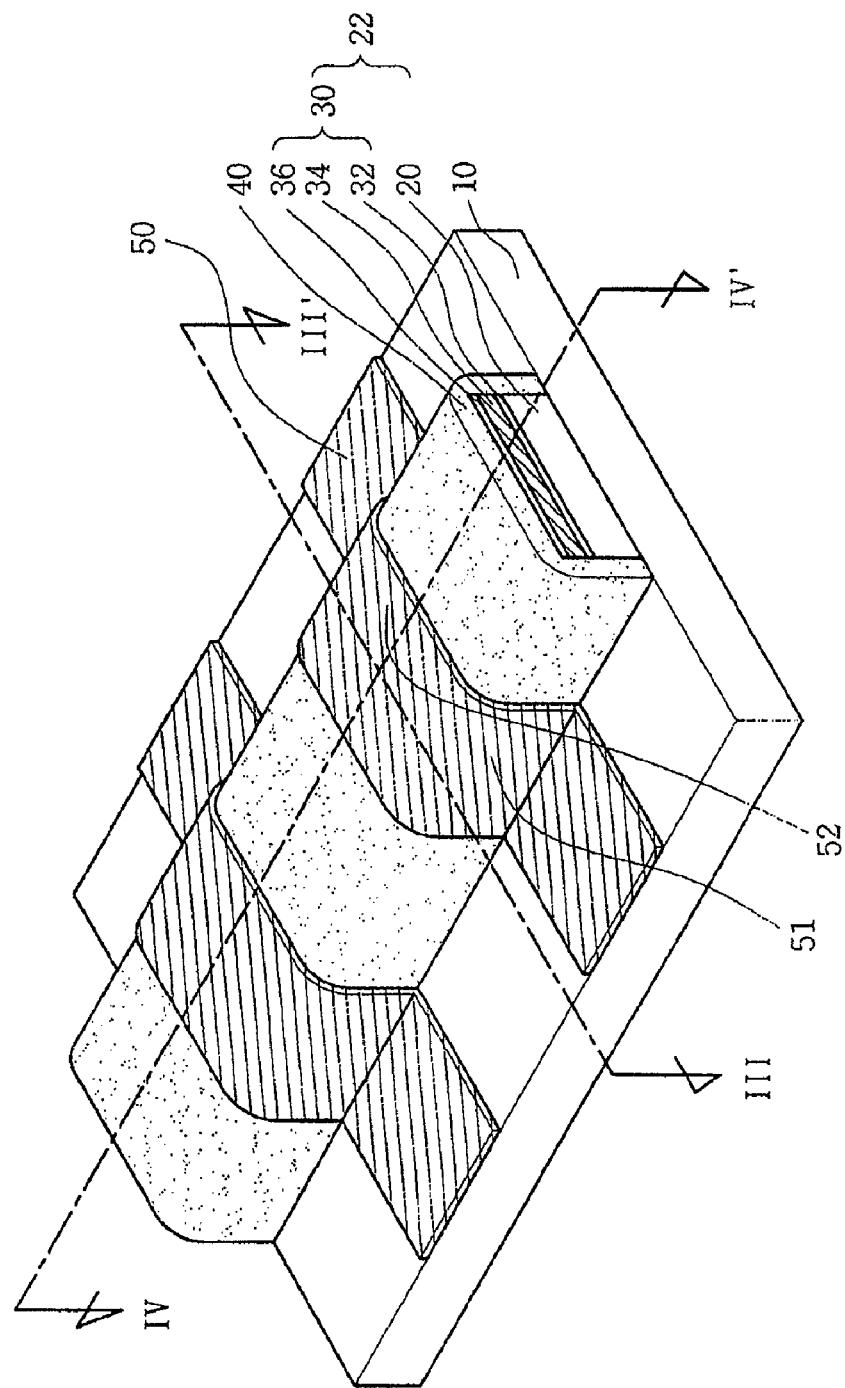
Figure 18B:
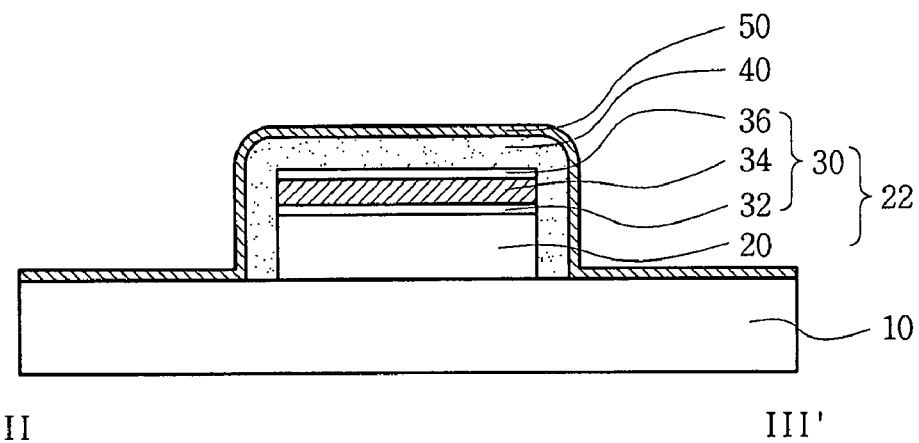
Figure 18C:
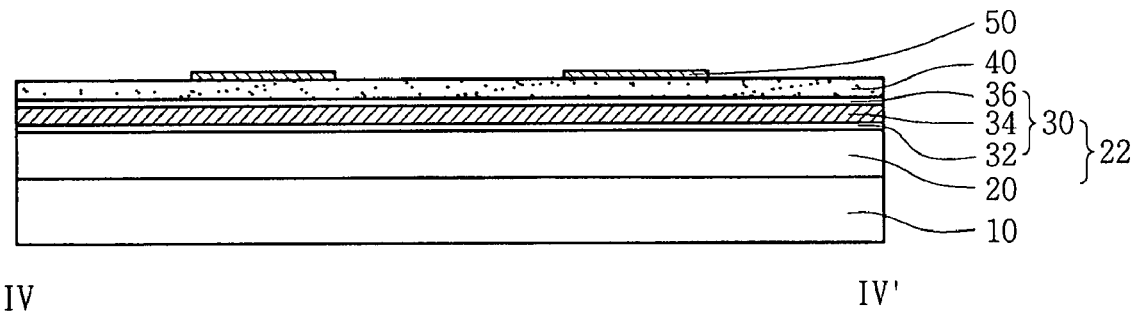

Referring to FIGS. 14A-14C, a second interlayer dielectric layer 90 is applied to the resulting structure, for example using chemical vapor deposition (CVD) of an insulative material, such as silicon oxide, to cover the resulting structure. In one embodiment, chemical-mechanical polishing is then performed to remove an upper portion of the second interlayer dielectric layer 90 to expose an upper portion of the read line 70. The resulting memory cell structure is shown and described above with reference to FIGS. 2A-2C. The illustration of FIGS. 2A-2C illustrates the device during the process prior to application of the second interlayer dielectric layer 90, as in FIGS. 13A-13C, so that the gaps 84A, 84B can be more readily viewed. In this embodiment, the lower and upper gaps 84A, 84B border the entire arch portion of the bit line 50, in the region where the bit line 50 intersects the write word line structure 22 and the read word line 70.

Figure 22A:
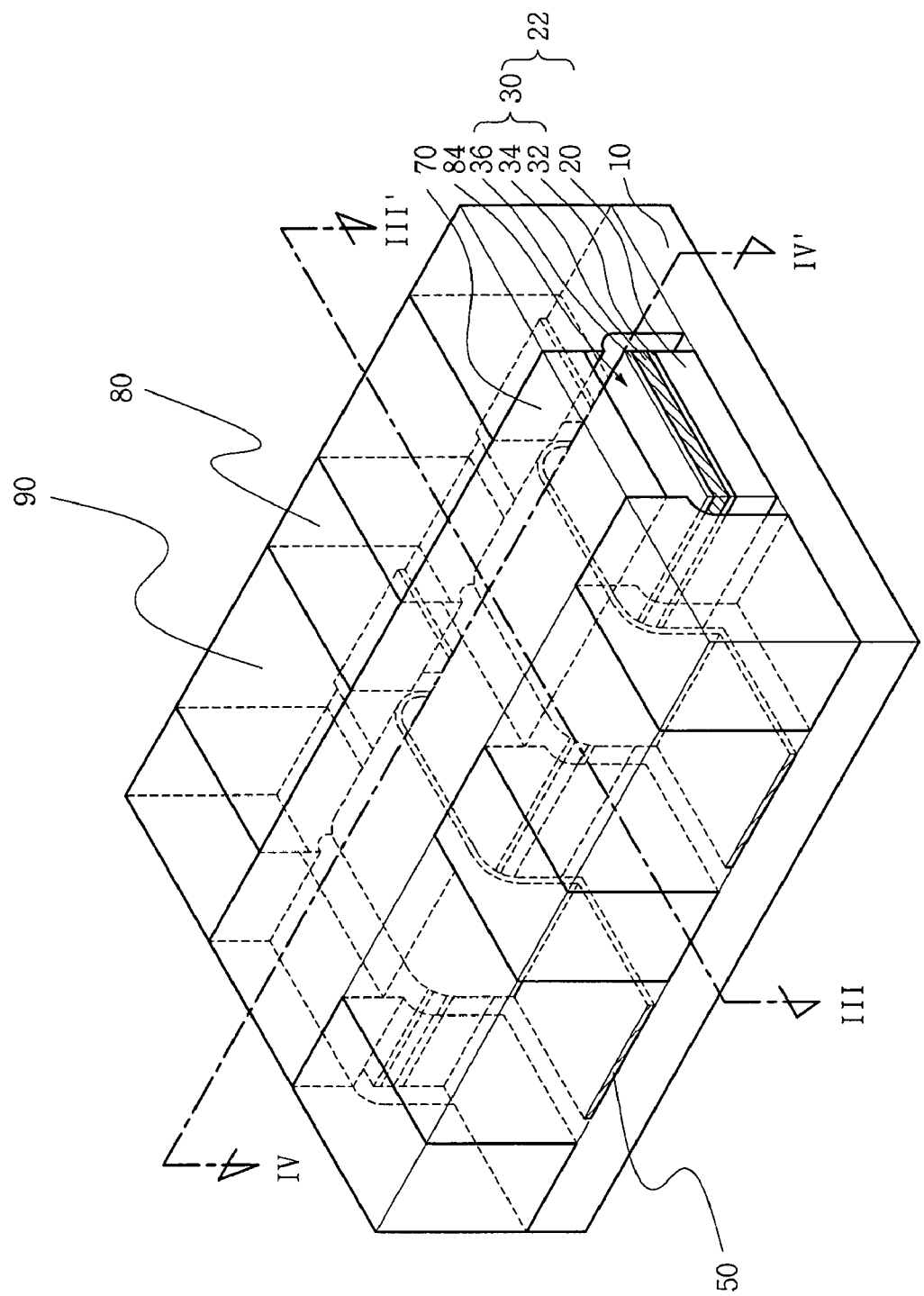

FIGS. 15A-22A are perspective views of a method for forming an electromechanical non-volatile memory device in accordance with another embodiment of the present invention. FIGS. 15B-22B are sectional views taken along section lines I-I' of FIGS. 15A-22A respectively. FIGS. 15C-22C are sectional views taken along section lines II-II' of FIGS. 15A-22A respectively. With reference to FIGS. 22A-22C, in the resulting device of this embodiment, the configuration of the lower gap 84A between the bit line 50 and the read word line structure 22 is the same as in the above-described embodiment; however, the configuration of the upper gap 84B between the read word line and the bit line is different than the above-described embodiment. Namely, in the present embodiment, the gap 84B extends between the read word line 70 and the bit line 50 for only the first portion 52 of the bit line, and the remainder of the arched portion of the bit line 50 is anchored to the interlayer dielectric layer 90. In addition, in this embodiment, the second sacrificial layer 60 and the read word line are formed using a damascene process.

Referring to FIGS. 15A-15C, 16A-16C, 17A-17C, and 18A-18C, the process steps illustrated in these diagrams are the same as those illustrated and described with reference to FIGS. 6A-6C, 7A-7C, 8A-8C, and 9A-9C above respectively. Therefore, further description of these figures is not repeated in connection with the present embodiment.

Figure 19A:
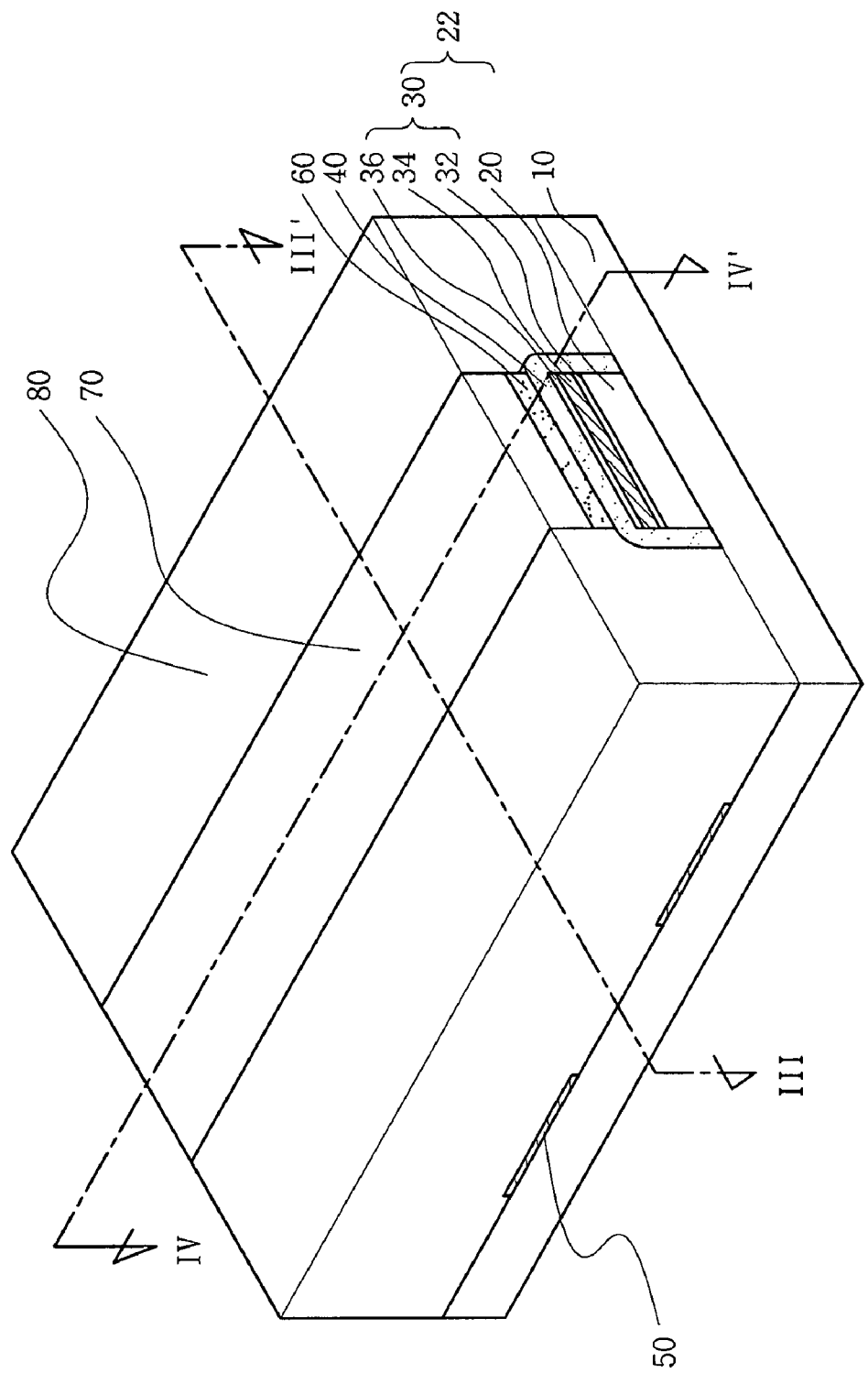
Figure 19B:
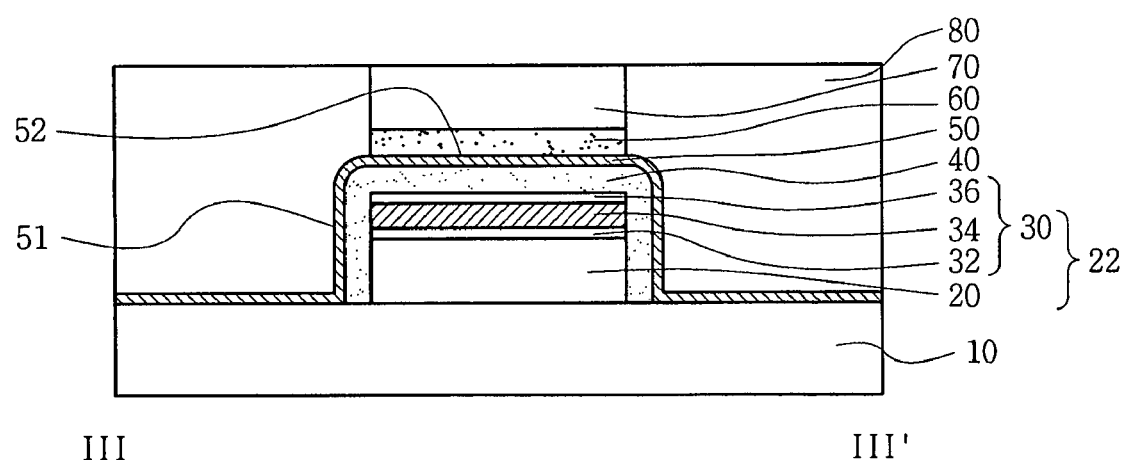
Figure 19C:
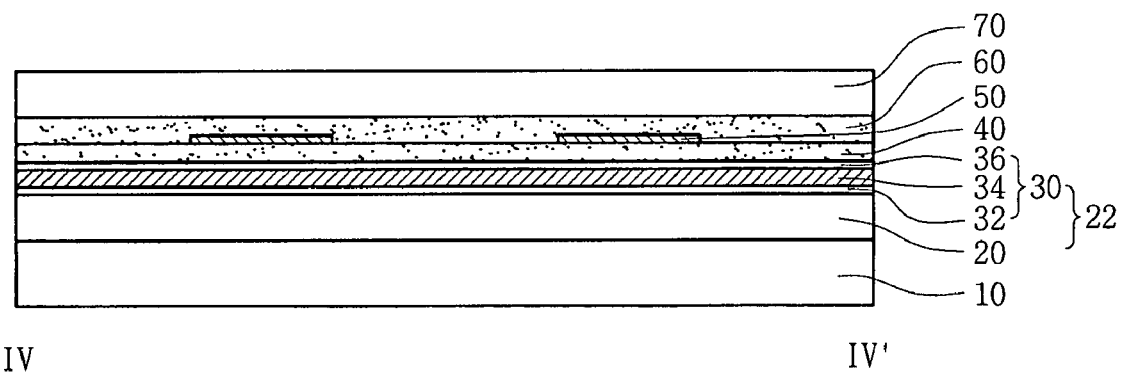

Referring to FIGS. 19A-19C, a second sacrificial layer 60 is formed and patterned on the top portion of the first sacrificial layer 40 and on the first portions 52 of the bit lines 50. The second sacrificial layer 60 is formed, for example, of polysilicon, nitride or oxide, using a CVD process, to a thickness of about 10-300 angstroms, and is patterned, for example, using standard photolithography techniques or by using a hard mask that is removed following patterning of the second sacrificial layer 60.

A read word line 70 is then formed and patterned on the second sacrificial layer 60. The read word line 70 can comprise, for example, a conductive material such as gold, silver, copper, aluminum, tungsten, titanium nitride, polysilicon or any other suitable conductive material that can be patterned to form the read word line 70. In one embodiment, the read word line 70 comprises a conductive metal layer, such as $WSi_2$, formed to a thickness of about 50 nm using a CVD process. The read word line 70 is formed above the write word line 20 and, like the write word line 20, extends in the first direction on the substrate, intersecting the bit lines 50. In the embodiment shown, the read word line 70 is of a width that that about the same as that of the underlying write word line structure 22; however, the respective widths may be different, depending on the application.

A first interlayer dielectric layer 80 is applied to the resulting structure, for example using chemical vapor deposition (CVD) of an insulative material, such as silicon oxide, to cover the resulting structure. In one embodiment, chemical-mechanical polishing is then performed to remove an upper portion of the first interlayer dielectric layer 80 to expose an upper portion of the read word line 70. In one embodiment, the first interlayer dielectric layer 80 comprises silicon oxide formed to a thickness of about 150 nm.

In an alternative embodiment, the second sacrificial layer 60 and read word line 70 can be formed using a damascene process whereby the first interlayer dielectric layer 80 is initially formed, and a trench that defines the position of the second sacrificial layer 60 and read word line 70 is subsequently formed in the interlayer dielectric layer 80 to expose an upper surface of the bit line 50 and the first sacrificial layer 40. The second sacrificial layer 60 and the read word line 70 are then applied in the trench according to damascene processes.

Figure 20A:
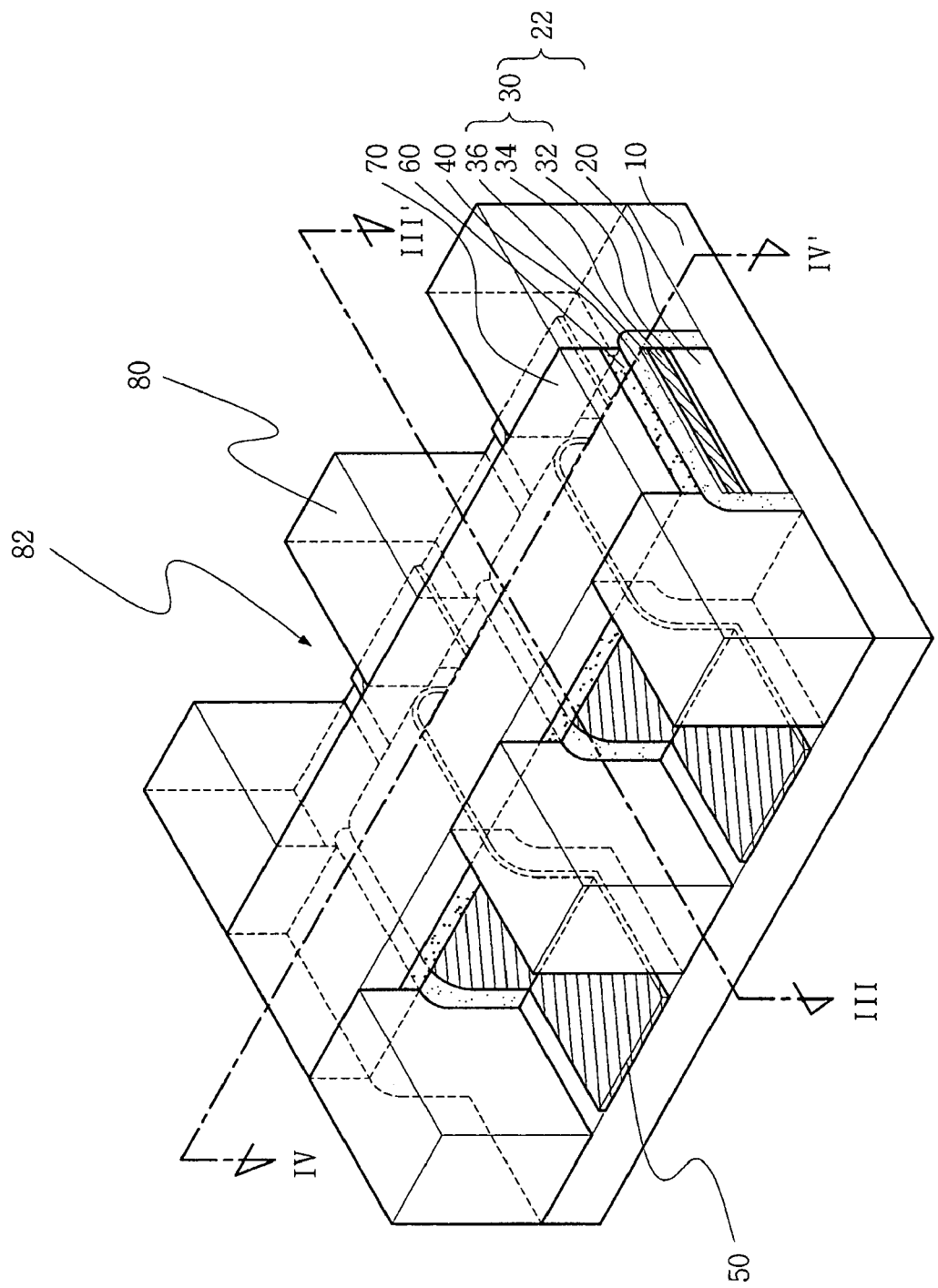
Figure 20B:
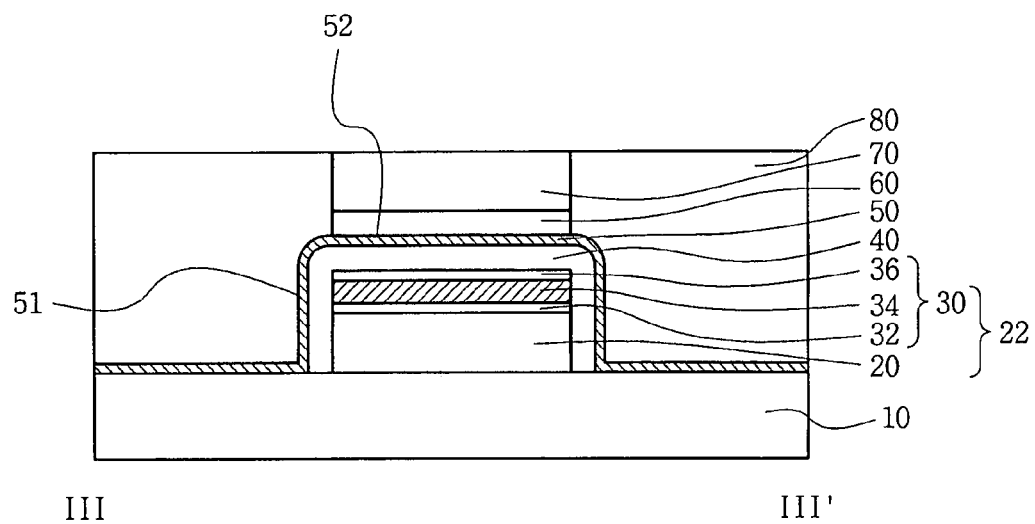
Figure 20C:
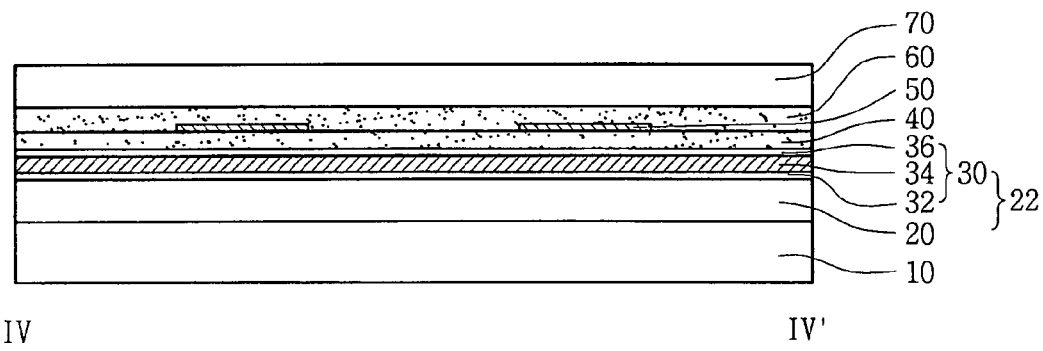
Figure 21A:
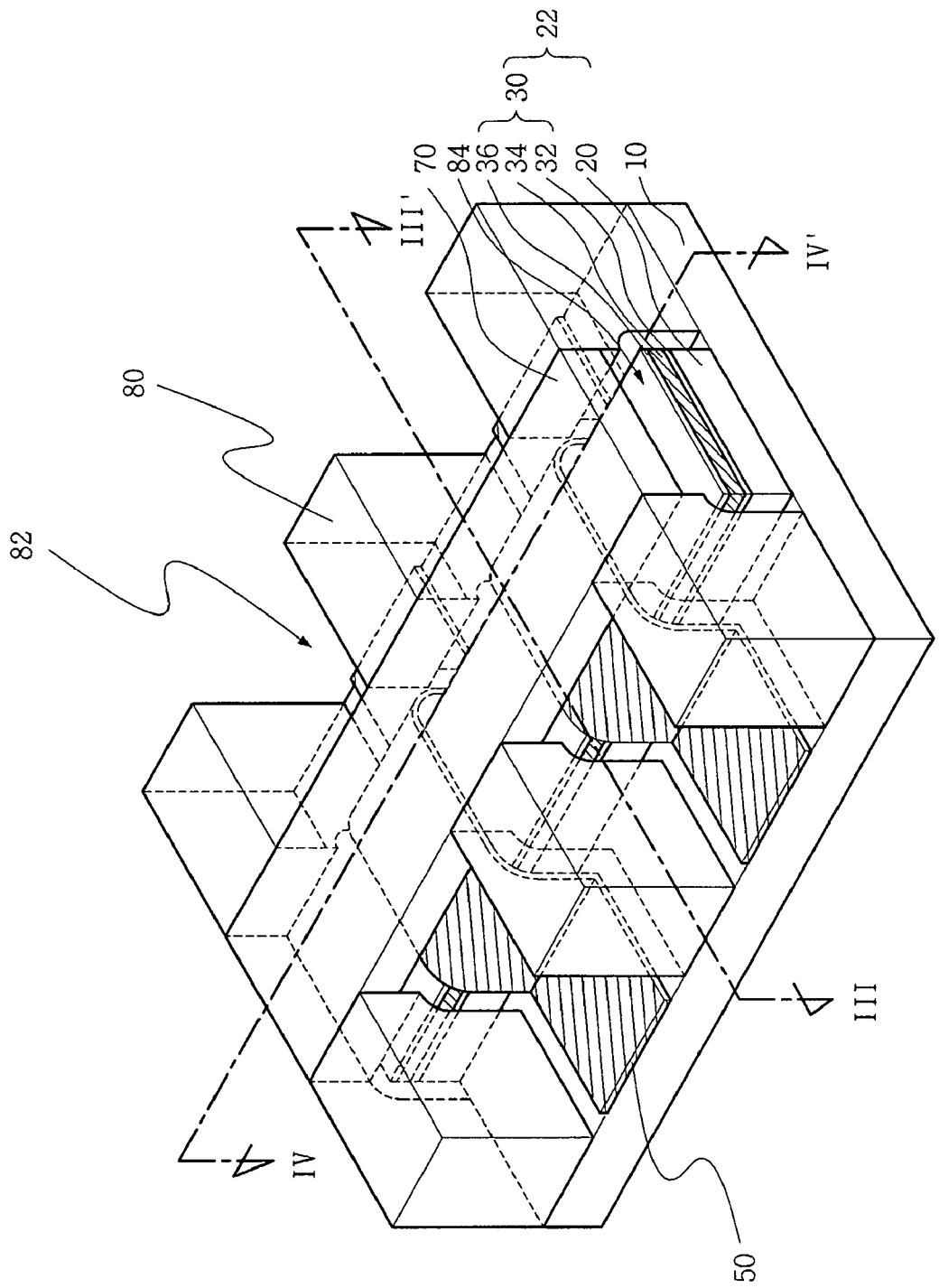
Figure 21B:
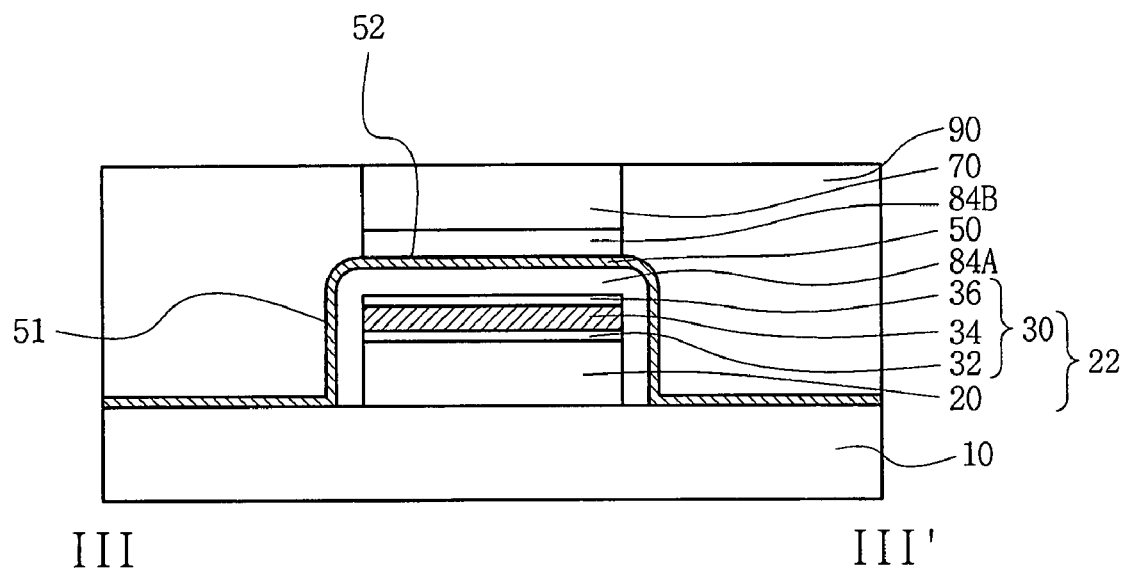
Figure 21C:
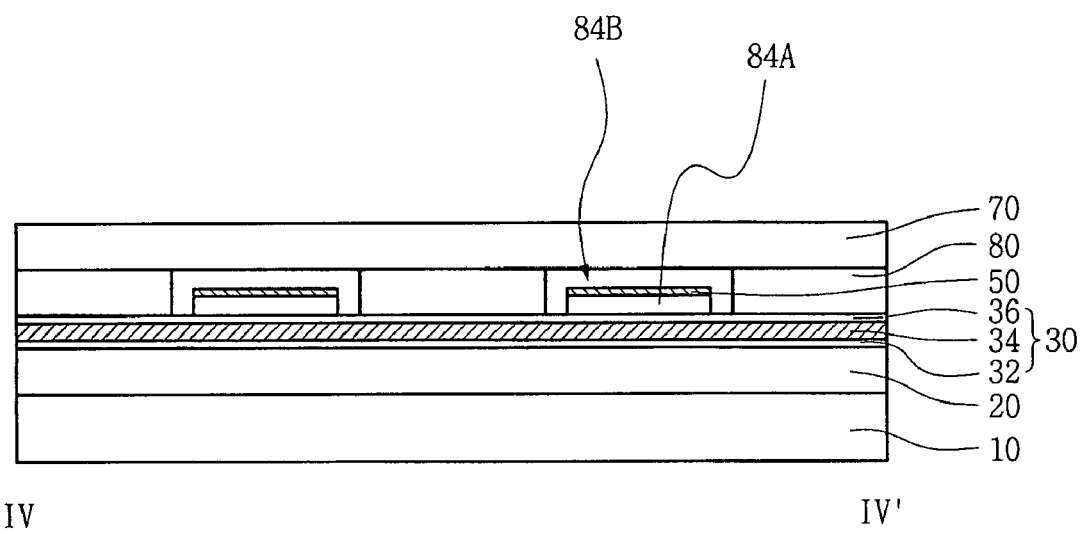

Referring to FIGS. 20A-20C, trenches 82 are formed in the first interlayer dielectric layer 80 to expose the bit lines 50 by selectively patterning the interlayer dielectric layer 80, for example, using a dry etch process, to remove only those portions that lie above the bit lines 20, and regions proximal to both sides of the bit lines 50. This exposes portions of the second sacrificial layer 60 that lie above the bit lines 50, as well as portions of the first sacrificial layer 40 that lie below the bit lines Referring to FIGS. 21A-21C, the first sacrificial layer 40 and the second sacrificial layer 60, are removed using a wet etching process or a CDE etch. Removal of the second sacrificial layer 60 undermines the read word line 70, and, as a result, an upper gap 84B is formed between the read word line 70 and the first portion 52 of the bit line 50. Removal of the first sacrificial layer 40 undermines the bit line 50, and, as a result, a lower gap 84A is formed between the bit line 50 and the write word line structure 22, including the charge trapping structure 30 and the write word line 20. The thicknesses of the applied first and second sacrificial layers 40, 60 thus define the resulting first and second gap distances 84A, 84B.

Figure 22B:
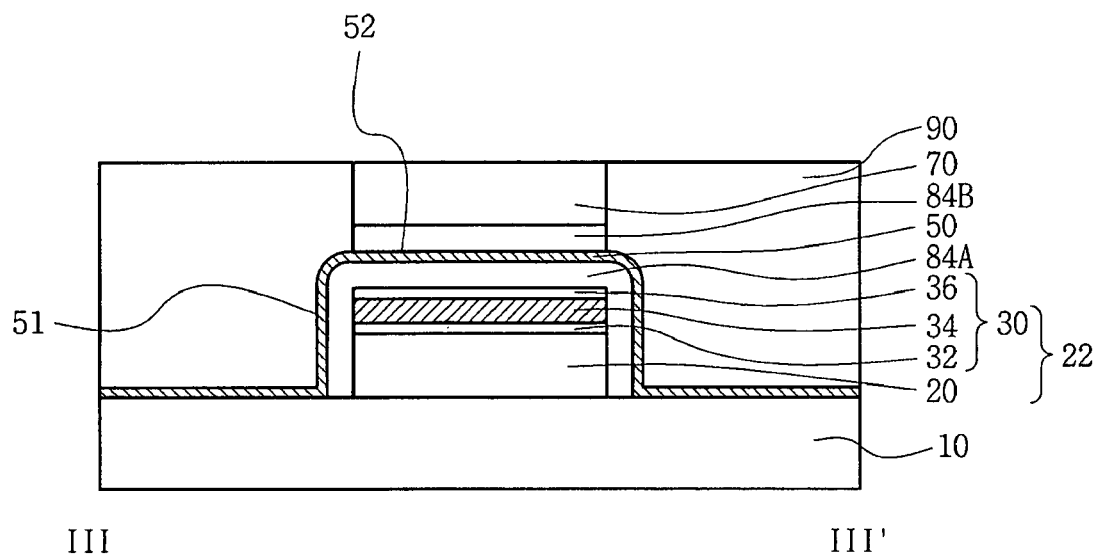
Figure 22C:
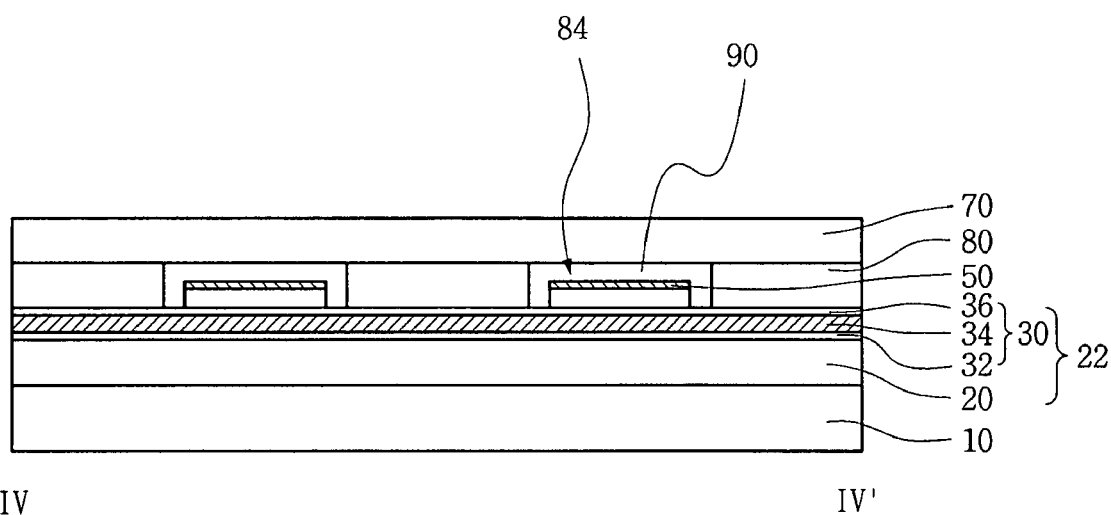

Referring to FIGS. 22A-22C, a second interlayer dielectric layer 90 is applied to the resulting structure, for example using chemical vapor deposition (CVD) of an insulative material, such as silicon oxide, to cover the resulting structure. In one embodiment, chemical-mechanical polishing is then performed to remove an upper portion of the second interlayer dielectric layer 90 to expose an upper portion of the read line 70. In this embodiment, the lower gap 84A borders the entire arch portion of the bit line 50, in the region where the bit line 50 intersects the write word line structure 22 and the read word line 70, and the upper gap 84B is limited to the first portion 52 of the bit line 50, as the remainder of the upper surface of the bit line 50 is in contact with the second interlayer dielectric layer 90.

While non-volatile embodiments of the electromechanical memory devices and fabrication methods thereof in accordance with the present invention are described above, the principles of the present invention are equally applicable to volatile memory devices, and fabrication methods thereof. In one illustrative example, FIG. 23 is a sectional view of an electromechanical volatile memory device in accordance with an embodiment of the present invention.

Figure 23:
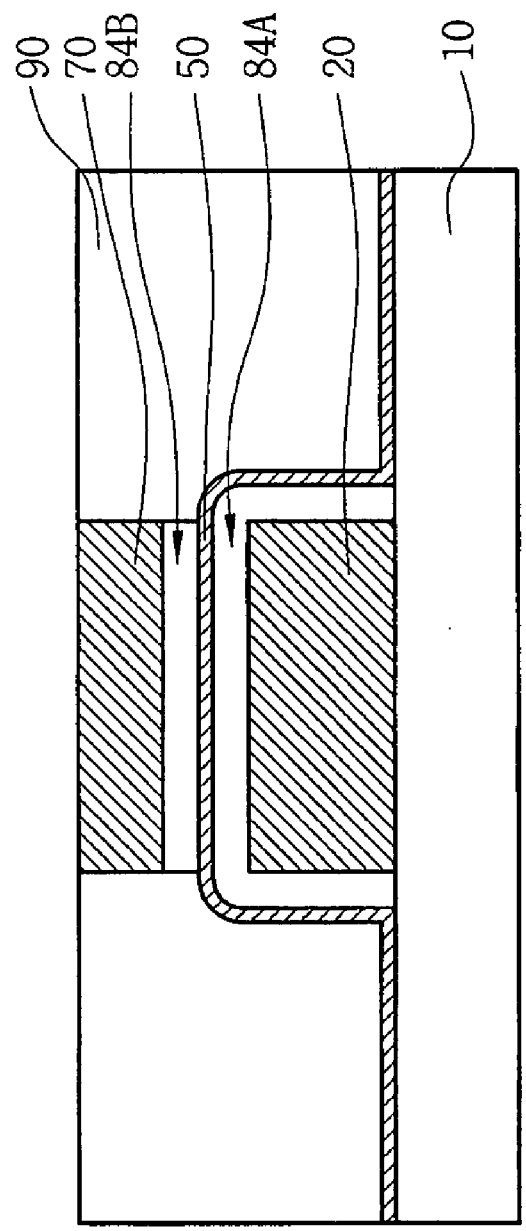
FIG. 23 is a sectional view of an electromechanical volatile memory device in accordance with an embodiment of the present invention.

The embodiment shown in FIG. 23 is substantially similar to the embodiment illustrated and described above in connection with FIGS. 22A-22C; however, in the present embodiment, the charge trapping structure 30 that is present in the above-described non-volatile memory device embodiment, is absent. Therefore, in the present embodiment, lower and upper gaps 84A, 84B are formed directly between the write word line 20 and the bit line 50, and directly between the read word line 70 and the bit line 50. Without the charge trapping structures of the above embodiments, when the applied voltage is removed from the write word line 20, the written information is not retained. In this embodiment, the "write word line structure" comprises the write word line itself, absent the charge trapping structure. Although the volatile memory cell embodiment of FIG. 23 is shown and described in connection with the configuration of FIGS. 22A-22C, the volatile memory cell embodiment of FIG. 23 is equally applicable to the configuration of FIGS. 14A-14C.

Figure 24A:
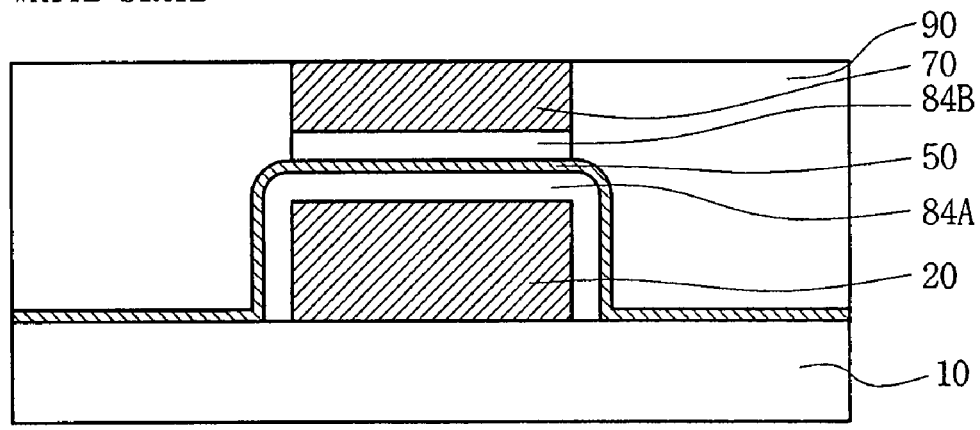
FIGS. 24A and 24B are sectional views of a unit memory cell in a first state and a read operation of the unit memory cell in the first state, for the volatile memory device embodiment of FIG. 23.
Figure 24B:
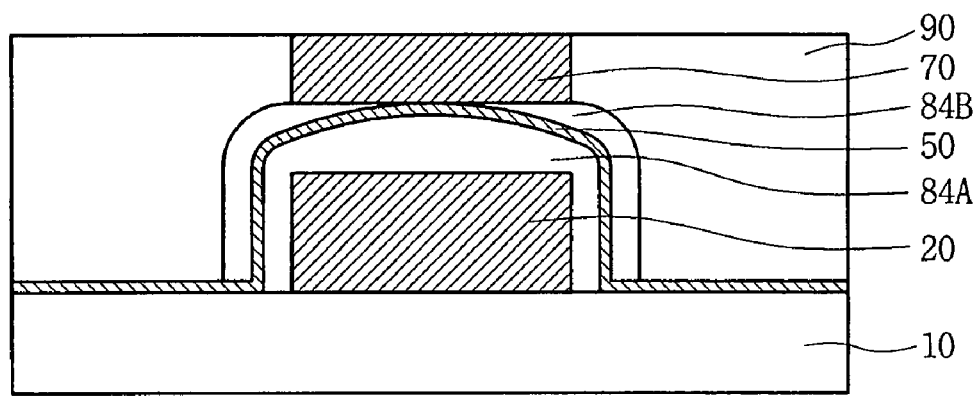

FIGS. 24A and 24B are sectional views of a unit memory cell 104 in a first state and a read operation of the unit memory cell 104 in the first state, for the volatile memory device embodiment of FIG. 23.

Referring to FIG. 24A, as a result of a write operation, the bit line electrode 50 is in a rest position, that is, in a suspended position between the write word line 20 and the read word line 70, and not engaging either the write word line 30 or the read word line 70. In one embodiment, this position of the bit line electrode 50 corresponds with a "1" binary state for the memory cell 104; however, in another embodiment, the bit line 50 being in such a rest position could equally be considered to correspond with a "0" binary state for the memory cell 104.

In the state of "1" as shown in FIG. 24A, the bit line electrode 50 is positioned at a suitable gap distance from the read word line 70 and remains in that position until a subsequent write operation or read operation occurs. During a subsequent read operation of the memory cell 104, a voltage potential is applied between the read word line 70 and the bit line 50 that is sufficient in magnitude to cause the bit line 50 to deflect from the rest position of FIG. 24A to an engaged position as shown in FIG. 24B, whereby the bit line 50 is bent in an upward direction through the upper gap 84B and such that the bit line 50 makes contact with a lower surface of the read word line 70. In this engaged position, a current is generated between the read word line 70 and the bit line 50. The current is sensed by current sensing circuitry connected to the read word line 70 of the device, which results in the read operation indicating a reading of a "1" state for the memory cell 104.

Figure 25A:
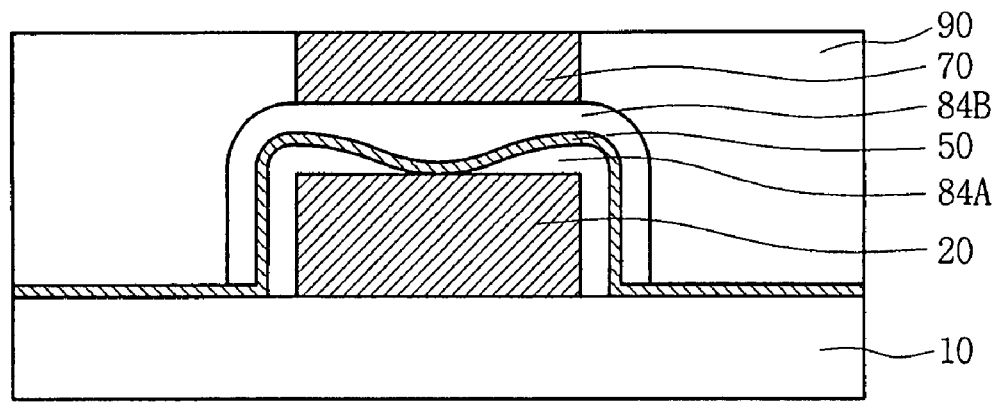
FIGS. 25A and 25B are sectional views of a unit memory cell in a second state and a read operation of the unit memory cell in the second state, for the volatile memory device embodiment of FIG. 23.
Figure 25B:
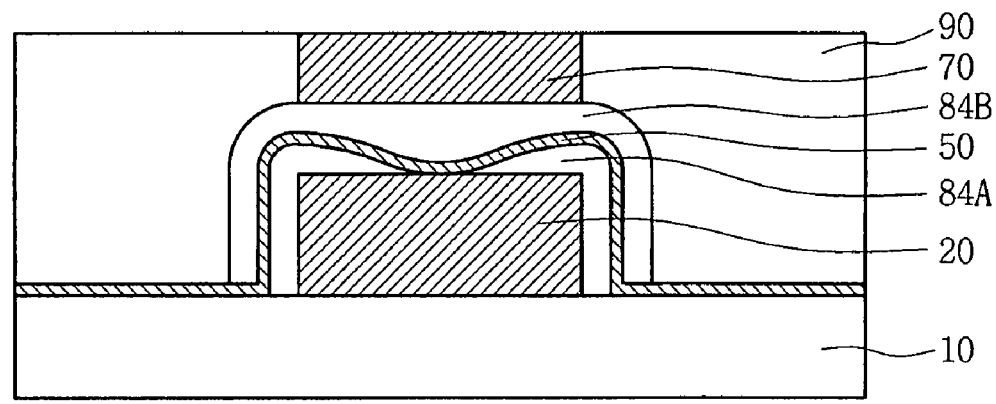

FIGS. 25A and 25B are sectional views of a unit memory cell 104 in a second state and a read operation of the unit memory cell 104 in the second state, for the non-volatile memory device embodiment of FIG. 23.

Referring to FIG. 25A, as a result of a write operation, the bit line 50 is in an engaged position, whereby the bit line 50 electrode is bent in a downward direction to make contact with an upper surface of the write word line 20. In one embodiment, this position of the bit line corresponds with a "0" binary state for the memory cell 104; however, in another embodiment, the bit line 50 being in such a bent position could equally be considered to correspond with a "1" binary state for the memory cell 104.

In the state of "0" as shown in FIG. 25A, the bit line 50 is bent so that it makes contact with an upper surface of write word line 20 and remains in that position, assuming a sustaining voltage is applied to the write word line 20, until a subsequent programming operation occurs. During a subsequent read operation of the memory cell 104, a voltage potential is applied between the read word line 70 and the bit line 50. A voltage potential for the read operation is selected that would have been sufficient in magnitude to cause the bit line 50 to deflect from the rest position of FIG. 24A to an engaged position with the lower surface of the read word line 70; however, the voltage potential applied between the read word line 70 and the bit line 50 for the read operation is not of sufficient magnitude so as to overcome the attractive force between the write word line 20 and the bit line 50. As a result, during a read operation of the memory cell 104 in the state shown in FIG. 25A, the bit line 50 remains in the same position, that is, in an engaged position with an upper surface of the write word line 20. Thus, during the read operation, when the read operation voltage potential is applied to the read word line 70 and the bit line 50, no current is generated between the read word line 70 and the bit line 50, because the bit line 50 in the downward-bent position does not operate to close the current path between the read word line 70 and the bit line 50. The lack of current, as detected by the corresponding current sensing circuitry, results in the read operation indicating a reading of a "0" state for the memory cell 104.

Figure 26:
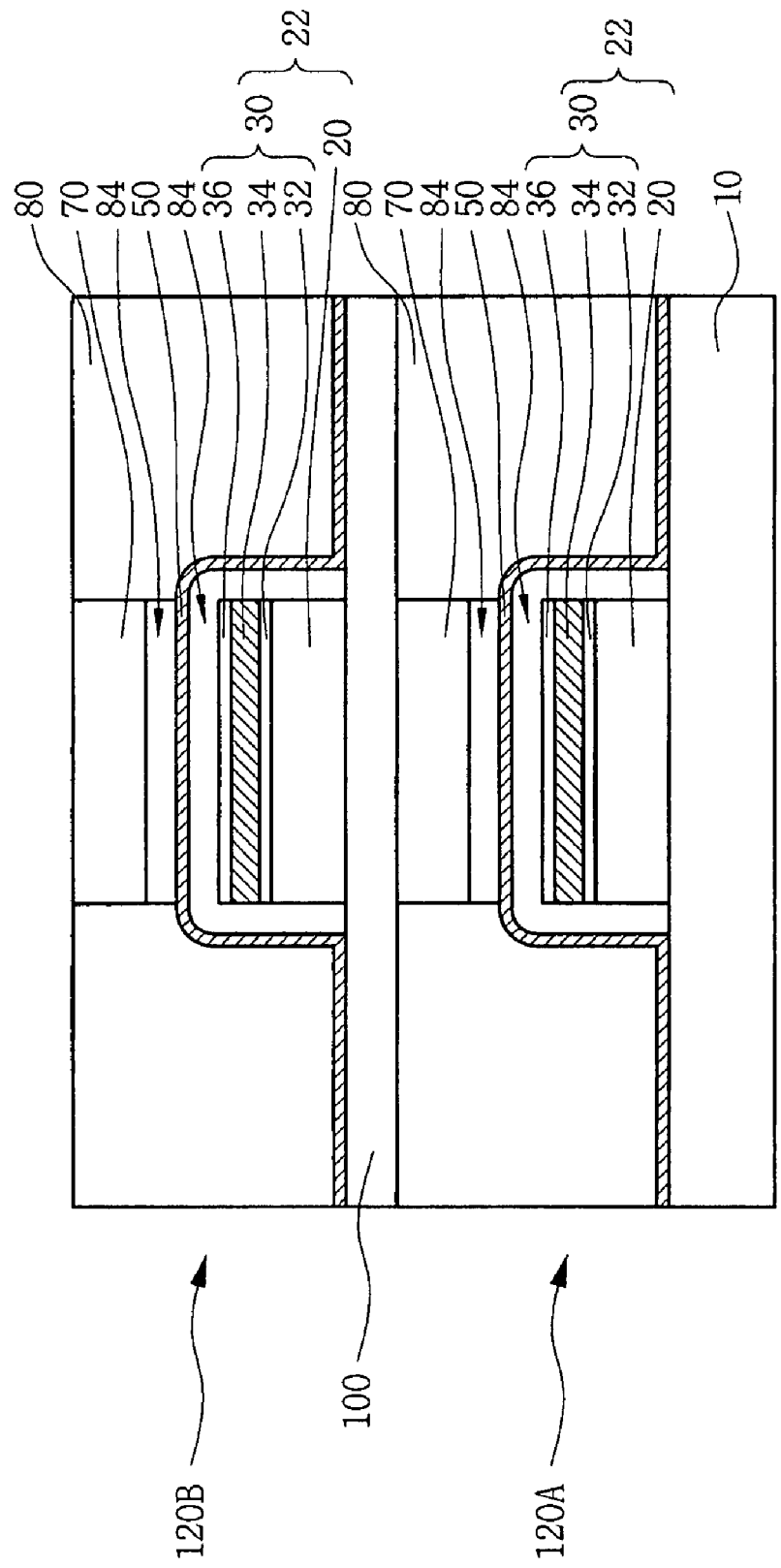
FIG. 26 is a sectional view of a stacked memory device including multiple layers of electromechanical memory cells, in accordance with an embodiment of the present invention.

FIG. 26 is a sectional view of a stacked memory device including multiple layers of electromechanical memory cells, in accordance with an embodiment of the present invention. In this embodiment, a first array of memory cells, for example of the non-volatile type described above, are provided on a first memory device layer 120A. An insulator layer 100 is provided on the first device layer 120A, and a second array of memory cells, for example, of the non-volatile type described above, are provided on a second memory device layer 120B. The second memory device layer 120B is provided on the insulator layer 100. Each of the first and second memory device layers 120A, 120B include memory cells having electromechanical memory units with arch-shaped bit lines 50 that are suspended between the lower word line structures 22, and the upper word lines 70, as described above. Additional device layers may be present above the second memory device layer 120B, or below the first memory device layer 120A, or between the first and second memory device layers 120A, 120B. The additional device layers can include memory cells and/or can include supporting circuitry, such as drive circuitry, for the stacked memory device.

Figure 27:
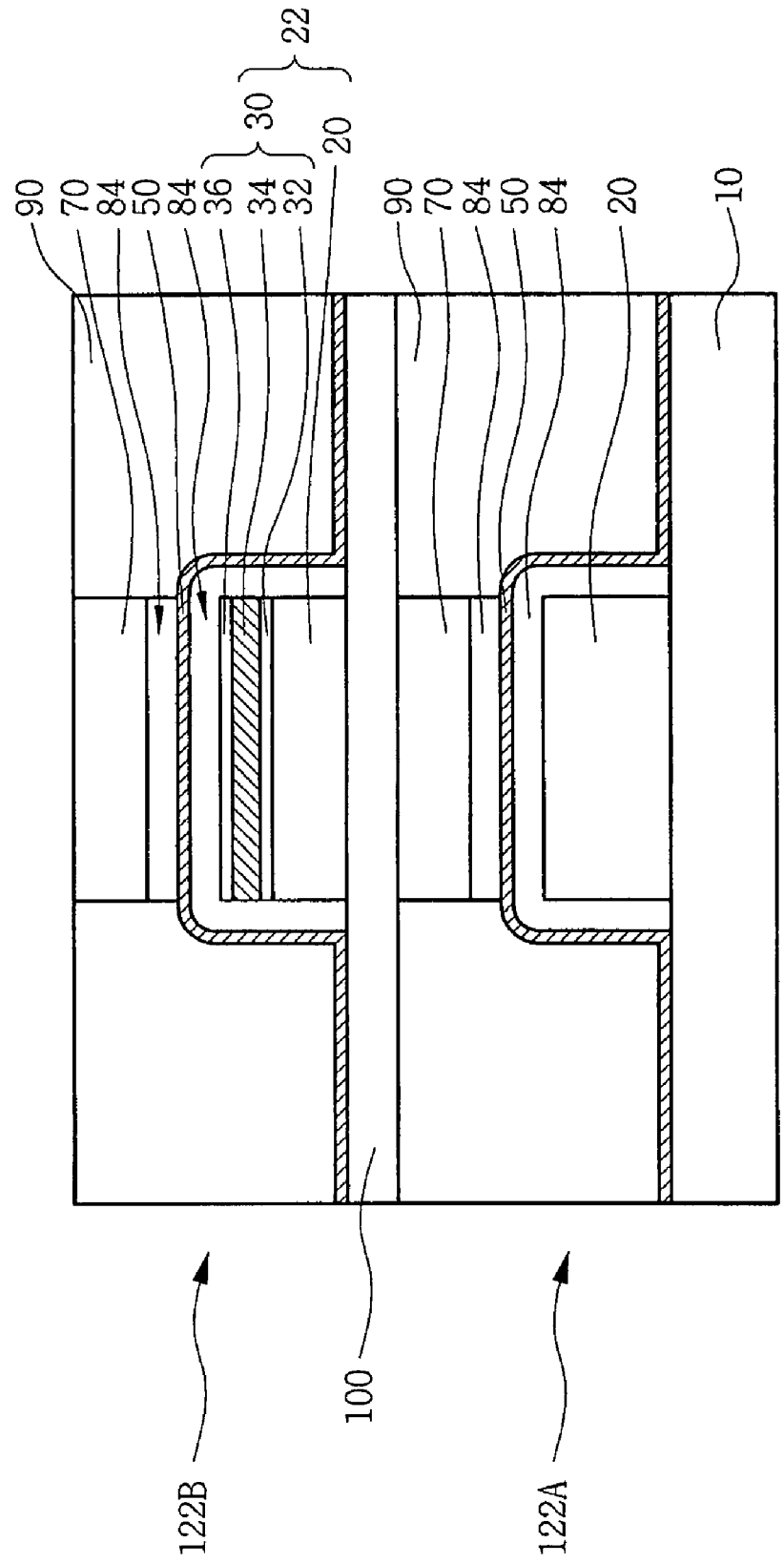
FIG. 27 is a sectional view of a stacked memory device including multiple layers of electromechanical memory cells, one of the layers including volatile memory cells and another of the layers including non-volatile memory cells, in accordance with an embodiment of the present invention.

FIG. 27 is a sectional view of a stacked memory device including multiple layers of electromechanical memory cells, one of the layers including volatile memory cells and another of the layers including non-volatile memory cells, in accordance with an embodiment of the present invention. In this embodiment, a first array of memory cells, for example of the volatile type described above, are provided on a first memory device layer 122A. An insulator layer 100 is provided on the first device layer 122A, and a second array of memory cells of a different type, for example, of the non-volatile type described above, are provided on a second memory device layer 122B. The second memory device layer 122B is provided on the insulator layer 100. Each of the first and second memory device layers 122A, 122B include memory cells with arch-shaped bit lines 50 that are suspended between the lower word line structures 22, and the upper word lines 70, as described above. Additional device layers may be present above the second memory device layer 122B, or below the first memory device layer 122A, or between the first and second memory device layers 122A, 122B. The additional device layers can include memory cells and/or can include supporting circuitry, such as drive circuitry, for the stacked memory device.

Although the stacked memory devices of FIGS. 26 and 27 utilize memory cells of the type shown and described above in connection with FIGS. 14A-14C, the stacked memory devices of FIGS. 26 and 27 are equally applicable to the memory cells of FIGS. 22A-22C. Such stacked memory devices lead to increased density in the resulting device.

In this manner, embodiments are described above that are directed to electromechanical memory devices and methods of manufacture thereof that address and alleviate the above-identified limitations of conventional devices. In particular, embodiments of the present invention provide electromechanical memory devices that realize, among other features, high-density storage, low-voltage program and erase voltages, high-speed operation, enhanced data retention, and high long-term endurance, and methods of formation of such devices. The embodiments of the present invention are applicable to both non-volatile and volatile memory device formats.

While the invention has been particularly shown and described with references to preferred embodiments thereof, it will be understood by those skilled in the art that various changes in form and detail may be made herein without departing from the spirit and scope of the invention as defined by the appended claims.

What is claimed is:

1. A memory device comprising:
a substrate;
a first word line structure on the substrate, the first word line structure extending in a first direction;
a bit line over the first word line structure and spaced apart from the first word line by a first gap, the bit line extending in a second direction transverse to the first direction; and
a second word line structure over the bit line and spaced apart from the bit line by a second gap, the second word line structure extending in the first direction,
wherein the bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

2. The memory device of claim 1 wherein the first word line structure comprises a write word line and wherein the second word line structure comprises a read word line.

3. The memory device of claim 1 wherein the bit line comprises first and second portions that extend in a direction along sidewalls of the first word line structure and a third portion that extends in a direction along a top of the first word line structure between the first and second portions.

4. The memory device of claim 3 wherein the first gap extends between the first and second portions of the bit line and the first word line structure and between the third portion of the bit line and the first word line structure.

5. The memory device of claim 3 further comprising a dielectric layer on the substrate and the bit line, and wherein the second gap extends between the third portion of the bit line and the second word line structure and extends between the first and second portions of the bit line and the dielectric layer.

6. The memory device of claim 3 wherein the second gap extends between the third portion of the bit line and the second word line structure.

7. The memory device of claim 1 wherein the bit line comprises an elastically deformable material.

8. The memory device of claim 7 wherein the bit line comprises at least one material selected from the group consisting of: gold, silver, copper, aluminum, tungsten, TiN, conductive metal, shaped memory alloy, and nanotubes.

9. The memory device of claim 1 wherein the first word line structure and second word line structure each comprise a conductor, and wherein the memory device comprises a volatile memory device.

10. The memory device of claim 1 wherein at least one of the first word line structure and the second word line structure comprises:
a conductive layer; and
a charge trapping structure between the conductive layer and the bit line and spaced apart from the bit line by a corresponding one of the first and second gaps, and wherein the memory device comprises a non-volatile memory device.

11. The memory device of claim 10 wherein in at least one of the first bent position and second bent position, the bit line is capacitively coupled to the charge trapping structure of the corresponding at least one first word line structure and second word line structure.

12. The memory device of claim 11 wherein in the at least one of the first bent position and second bent position, the bit line is further capacitively coupled to the conductive layer of the corresponding at least one first word line structure and second word line structure.

13. The memory device of claim 10 wherein the charge trapping structure comprises a structure selected from the group consisting of: an oxide-nitride-oxide (ONO) structure and an oxide-nitride-alumina (ONA) structure.

14. The memory device of claim 10 further comprising a transition layer between the conductive layer and the charge trapping structure of the at least one of the first and second word line structures.

15. The memory device of claim 10 wherein one of the first and second word line structures comprises a write word line structure and wherein another of the first and second word line structures comprises a read word line structure, and wherein, during a write operation of the non-volatile memory device, the bit line is placed in one of the a bent position in contact with the write word line structure and the rest position, by applying a first voltage potential between the write word line structure and the bit line.

16. The memory device of claim 15 wherein during a write operation of a first state of the non-volatile memory device that results in the bit line being placed in a bent position in contact with the write word line structure, the bit line bends to make contact with the charge trapping structure of the write word line structure in the bent position in response to the first voltage potential between the write word line structure and the bit line, and wherein, when the first voltage potential between the write word line structure and the bit line is removed, the bit line remains in the bent position as a result of charge that is trapped in the charge trapping structure of the write word line structure.

17. The memory device of claim 16 wherein during a read operation of the non-volatile memory device in the first state, a second voltage potential is applied between the bit line and the read word line structure, and wherein the read operation results in the determination of the first state when the bit line remains in the bent position in contact with the write word line structure, despite application of the second voltage potential.

18. The memory device of claim 15 wherein during a write operation of a second state of the non-volatile memory device that results in the bit line being placed in the rest position, the bit line is isolated from the charge trapping structure of the write word line structure in the rest position in response to the first voltage potential between the write word line structure and the bit line, and wherein, when the first voltage potential between the write word line structure and the bit line is removed, the bit line remains in the rest position.

19. The memory device of claim 18 wherein during a read operation of the non-volatile memory device in the second state, a second voltage potential is applied between the bit line and the read word line structure, and wherein the read operation results in the determination of the second state when the bit line is placed in a bent position in contact with the read word line structure as a result of the applied second voltage potential.

20. The memory device of claim 1 wherein the first word line structure comprises a conductive layer and a charge trapping structure on the conductive layer, the charge trapping structure between the conductive layer of the first word line structure and the bit line, and the charge trapping structure being spaced apart from the bit line by the first gap, and wherein the memory device comprises a non-volatile memory device.

21. The memory device of claim 1 wherein the second word line structure comprises a conductive layer and a charge trapping structure under the conductive layer, the charge trapping structure between the conductive layer of the second word line structure and the bit line, and the charge trapping structure being spaced apart from the bit line by the second gap, and wherein the memory device comprises a non-volatile memory device.

22. A memory device comprising:
a substrate;
a first word line structure on the substrate, the first word line structure extending in a first direction;
a bit line over the first word line structure and spaced apart from the first word line by a first gap, the bit line extending in a second direction transverse to the first direction; and
a second word line structure over the bit line and spaced apart from the bit line by a second gap, the second word line structure extending in the first direction,
wherein one of the first word line structure and the second word line structure comprises a charge trapping structure between a conductive layer of one of the word line structures and the bit line, wherein the charge trapping structure is spaced apart from the bit line by a corresponding one of the first and second gaps, and
wherein the bit line is suspended between the first word line structure and the second word line structure such that the bit line deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

23. The memory device of claim 22 wherein the one of the first and second word line structures comprises a write word line and wherein the other of the first and second word line structures comprises a read word line.

24. The memory device of claim 22 wherein the bit line comprises first and second portions that extend in a direction along sidewalls of the first word line structure and a third portion that extends in a direction along a top of the first word line structure between the first and second portions.

25. The memory device of claim 24 wherein the first gap extends between the first and second portions of the bit line and the first word line structure and between the third portion of the bit line and the first word line structure.

26. The memory device of claim 24 further comprising a dielectric layer on the substrate and the bit line, and wherein the second gap extends between the third portion of the bit line and the second word line structure and extends between the first and second portions of the bit line and the dielectric layer.

27. The memory device of claim 24 wherein the second gap extends between the third portion of the bit line and the second word line structure.

28. The memory device of claim 22 wherein the bit line comprises an elastically deformable material.

29. The memory device of claim 28 wherein the bit line comprises at least one material selected from the group consisting of: gold, silver, copper, aluminum, tungsten, TiN, conductive metal, shaped memory alloy, and nanotubes.

30. The memory device of claim 22 wherein in at least one of the first bent position and second bent position, the bit line is capacitively coupled to the charge trapping structure of the corresponding at least one first word line structure and second word line structure.

31. The memory device of claim 30 wherein in the at least one of the first bent position and second bent position, the bit line is further capacitively coupled to the conductive layer of the corresponding at least one first word line structure and second word line structure.

32. The memory device of claim 22 wherein the charge trapping structure comprises a structure selected from the group consisting of: an oxide-nitride-oxide (ONO) structure and an oxide-nitride-alumina (ONA) structure.

33. The memory device of claim 22 further comprising a transition layer between the conductive layer and the charge trapping structure of the at least one of the first and second word line structures.

34. The memory device of claim 22 wherein the one of the first and second word line structures comprises a write word line structure and wherein another of the first and second word line structures comprises a read word line structure, and wherein, during a write operation of the non-volatile memory device, the bit line is placed in one of the a bent position in contact with the write word line structure and the rest position, by applying a first voltage potential between the write word line structure and the bit line.

35. The memory device of claim 34 wherein during a write operation of a first state of the non-volatile memory device that results in the bit line being placed in a bent position in contact with the write word line structure, the bit line bends to make contact with the charge trapping structure of the write word line structure in the bent position in response to the first voltage potential between the write word line structure and the bit line, and wherein, when the first voltage potential between the write word line structure and the bit line is removed, the bit line remains in the bent position as a result of charge that is trapped in the charge trapping structure of the write word line structure.

36. The memory device of claim 35 wherein during a read operation of the non-volatile memory device in the first state, a second voltage potential is applied between the bit line and the read word line structure, and wherein the read operation results in the determination of the first state when the bit line remains in the bent position in contact with the write word line structure, despite application of the second voltage potential.

37. The memory device of claim 34 wherein during a write operation of a second state of the non-volatile memory device that results in the bit line being placed in the rest position, the bit line is isolated from the charge trapping structure of the write word line structure in the rest position in response to the first voltage potential between the write word line structure and the bit line, and wherein, when the first voltage potential between the write word line structure and the bit line is removed, the bit line remains in the rest position.

38. The memory device of claim 37 wherein during a read operation of the non-volatile memory device in the second state, a second voltage potential is applied between the bit line and the read word line structure, and wherein the read operation results in the determination of the second state when the bit line is placed in a bent position in contact with the read word line structure as a result of the applied second voltage potential.

* * * * *